US009488710B2

(12) United States Patent
Boada et al.

(10) Patent No.: US 9,488,710 B2
(45) Date of Patent: Nov. 8, 2016

(54) MRI PULSE SEQUENCE BASED ON Q-SPACE TRAJECTORY TECHNIQUE

(71) Applicants: Fernando E. Boada, Wexford, PA (US); Stephen Ross Yutzy, Seven Fields, PA (US)

(72) Inventors: Fernando E. Boada, Wexford, PA (US); Stephen Ross Yutzy, Seven Fields, PA (US)

(73) Assignee: University of Pittsburgh—Of the Commonwealth System of Higher Education, Pittsburgh, PA (US)

( * ) Notice: Subject to any disclaimer, the term of this patent is extended or adjusted under 35 U.S.C. 154(b) by 890 days.

(21) Appl. No.: 13/832,891

(22) Filed: Mar. 15, 2013

(65) Prior Publication Data

US 2013/0278257 A1   Oct. 24, 2013

Related U.S. Application Data

(60) Provisional application No. 61/611,328, filed on Mar. 15, 2012.

(51) Int. Cl.
*G01R 33/561* (2006.01)
*G01R 33/563* (2006.01)

(52) U.S. Cl.
CPC ....... *G01R 33/561* (2013.01); *G01R 33/56341* (2013.01)

(58) Field of Classification Search
CPC ................ G01R 33/561; G01R 33/56341
See application file for complete search history.

(56) References Cited

U.S. PATENT DOCUMENTS

| | | | | |
|---|---|---|---|---|
| 7,047,060 | B1 * | 5/2006 | Wu ................. | G01R 33/563 324/307 |
| 8,461,840 | B2 * | 6/2013 | Stemmer ........... | G01R 33/5611 324/307 |
| 8,570,034 | B2 * | 10/2013 | Stemmer ........... | G01R 33/246 324/307 |
| 8,729,897 | B2 * | 5/2014 | Porter .............. | G01R 33/5617 324/309 |

OTHER PUBLICATIONS

David A. Porter, et al., High Resolution Diffusion-Weighted Imaging Using Readout-Segmented Echo-Planar Imaging, Parallel Imaging and a Two-Dimensional Navigator-Based Reacquisition, Magnetic Resonance in Medicine, 2009, 468-475, 62.

* cited by examiner

*Primary Examiner* — Dixomara Vargas
(74) *Attorney, Agent, or Firm* — Eckert Seamans Cherin & Mellott, LLC; Philip E. Levy

(57) ABSTRACT

Systems and methods capable of improving acquisition times associated with obtaining diffusion-weighted magnetic resonance imaging data are discussed. In aspects, multiple points in q-space can be sampled in a single repetition time (TR). Acquisition time can be further increased using other techniques, such as a radial raster or compressed sensing.

20 Claims, 21 Drawing Sheets

MRI PULSE SEQUENCE BASED ON Q-SPACE TRAJECTORY TECHNIQUE

CROSS-REFERENCE TO RELATED APPLICATIONS

This application claims the benefit of U.S. Provisional Patent application Ser. No. 61/611,328 entitled 'MRI PULSE SEQUENCE BASED ON QSPACE TRAJECTORY TECHNIQUE' and filed Mar. 15, 2012. The entirety of the above-noted application is incorporated by reference herein.

NOTICE ON GOVERNMENT FUNDING

This innovation was made with government support under grant # MH088370 awarded by the National Institutes of Health. The government has certain rights in the invention.

BACKGROUND

White matter tractography is gaining popularity in many applications, such as pre-surgical planning and mapping cortical connections. However, many regions of white matter exhibit complex fiber crossing behavior, necessitating lengthy sampling schemes such as diffusion spectrum imaging (DSI) or q-ball imaging to properly resolve these crossings. These techniques sample q-space to estimate the orientation distribution function (ODF) of white matter fibers. The resultant long scan times may prevent these techniques from achieving widespread clinical utility. A typical diffusion-weighted pulse sequences using one of these q-space sampling schemes acquires one point in q-space in each repetition time (TR). In techniques with points at multiple radii in q-space, this results in multiple diffusion preparation (DP) steps in the same or similar directions, resulting in redundant travel through q-space.

SUMMARY

The following presents a simplified summary of the innovation in order to provide a basic understanding of some aspects of the innovation. This summary is not an extensive overview of the innovation. It is not intended to identify key/critical elements of the innovation or to delineate the scope of the innovation. Its sole purpose is to present some concepts of the innovation in a simplified form as a prelude to the more detailed description that is presented later.

The innovation disclosed and claimed herein, in one aspect thereof, comprises a method of diffusion weighted (DW) magnetic resonance imaging (MRI). Such a method can employ a q-space trajectory to sample multiple points in q-space for each repetition time (TR). Such a method can include the steps of applying a single radio frequency (RF) excitation pulse to excite a first set of nuclei associated with a first slice, applying a first diffusion preparation (DP) to the set of nuclei, and obtaining first diffusion data associated with a first point in q-space via application of a first signal readout. The method can also include applying a second DP to the set of nuclei during the same TR, and obtaining second diffusion data associated with a second point in q-space via application of a second signal readout.

In other aspects, the subject innovation can include systems and methods capable of further improving acquisition times using other techniques described herein, such as a radial raster or compressed sensing.

To the accomplishment of the foregoing and related ends, certain illustrative aspects of the innovation are described herein in connection with the following description and the annexed drawings. These aspects are indicative, however, of but a few of the various ways in which the principles of the innovation can be employed and the subject innovation is intended to include all such aspects and their equivalents. Other advantages and novel features of the innovation will become apparent from the following detailed description of the innovation when considered in conjunction with the drawings.

DETAILED DESCRIPTION

Figure 1:
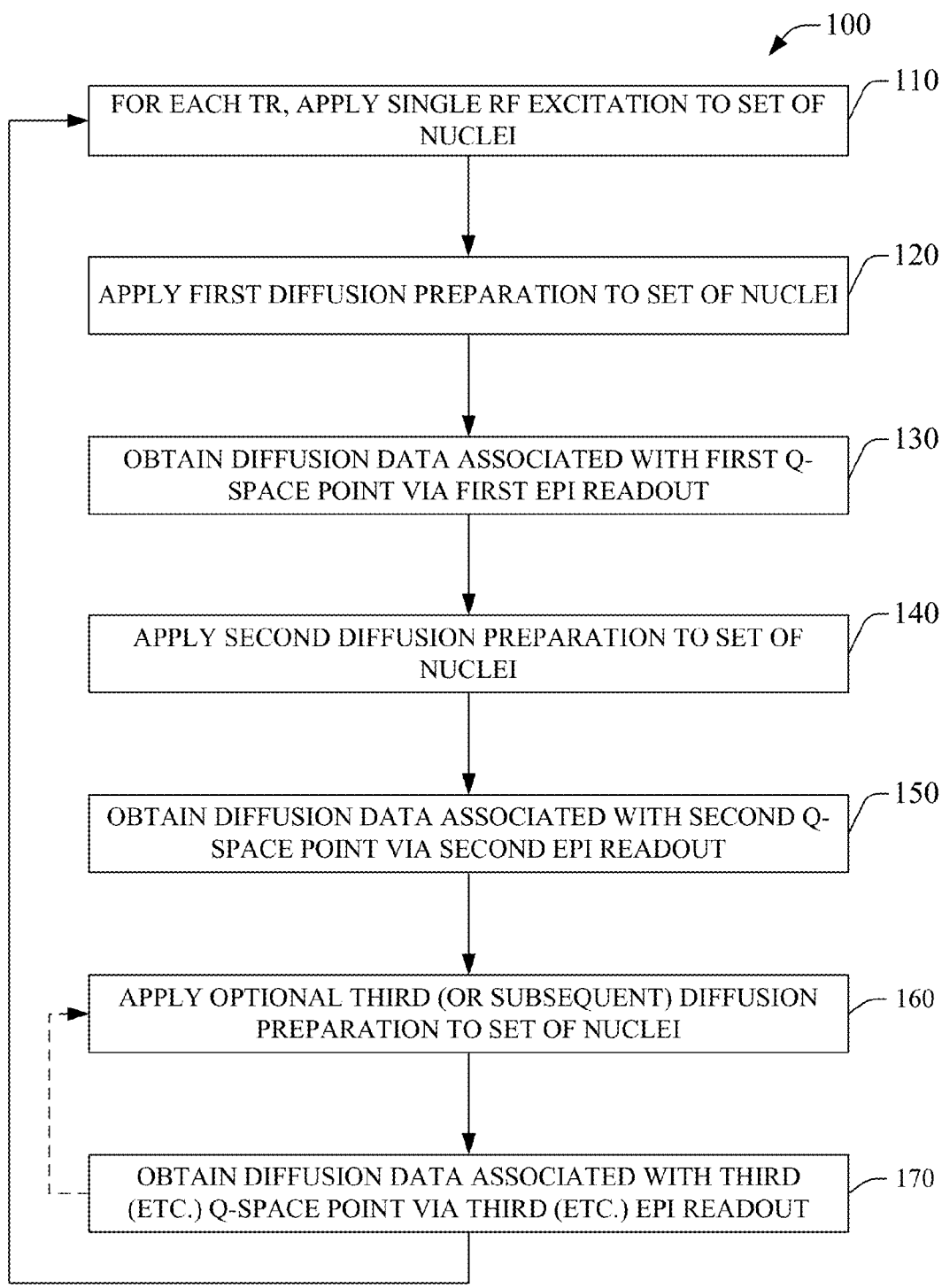
FIG. 1 illustrates a method of applying a magnetic resonance imaging (MRI) pulse sequence useable for acquiring diffusion weighted imaging data via acquisition of multiple q-space samples in a single repetition time, in accordance with an aspect of the innovation.

The innovation is now described with reference to the drawings, wherein like reference numerals are used to refer to like elements throughout. In the following description, for purposes of explanation, numerous specific details are set forth in order to provide a thorough understanding of the subject innovation. It may be evident, however, that the innovation can be practiced without these specific details. In other instances, well-known structures and devices are shown in block diagram form in order to facilitate describing the innovation.

As used in this application, the terms "component" and "system" are intended to refer to a computer-related entity, either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution, and a component can be localized on one computer and/or distributed between two or more computers.

One recent advance in white matter tractography, High-definition Fiber Tracking (HDFT) (described in co-pending Patent Cooperation Treaty Application No. PCT/US12/29229, entitled "DIRECTIONAL DIFFUSION FIBER TRACKING" and filed Mar. 15, 2012, the entirety of which is incorporated by reference herein), relies on diffusion spectrum imaging (DSI) to provide renditions of the white-matter fiber tract architecture with a resolution, reproducibility and anatomical accuracy that was previously unattainable. This methodology was quickly adopted by the local neurosurgical team as an integral part of the armamentarium used to plan surgical approaches during challenging cases where sparing of non-diseased brain tissue must be maximized Two critical aspects of this technology have, however, prevented its widespread use around the neurosurgical community, namely, acquisition speed and anatomical validation.

Currently, acquisition of the high-resolution DSI data required by HDFT requires 45 minutes of acquisition time using state-of-the-art magnetic resonance imaging (MRI) hardware (3 Tesla scanner with a 32-channel head coil together with Parallel Imaging and Partial Fourier (PF)). Such long data acquisition times are not well suited for routine clinical use due to their increased motion sensitivity, poor patient tolerance and challenging workflow. In addition, anatomical validation of the accuracy of the technique cannot be performed on an adequately large statistical sample unless means to acquire the DSI data on biological intact tissue can be sped up.

In aspects, the subject innovation discloses novel q-space sampling schemes for achieving shorter data acquisition times, such as for white matter tractography (e.g., HDFT, etc.). The use of novel q-space sampling rasters disclosed herein, together with hardware-based reduced sampling approaches (such as multi-band data acquisition), will lead to much faster data acquisition times (from 45 minutes to 15 minutes) for DSI than those available using the conventional Cartesian rasters. Use of such novel DSI technology in the clinical setting could lead to reduced morbidity and improved prognosis for a large number of neurosurgical procedures where preservation of function is an important outcome measure. Various aspects of the subject innovation can be used to improve acquisition time or quality (which can allow for comparable quality in a shorter time).

In aspects, the subject innovation can utilize q-space trajectories that sample multiple q-space locations per RF excitation and provide improved angular resolution without the need for very large b-values. This technique is conceptually similar to improving the k-space coverage per unit time using trajectories that exploit the geometry of the sampling raster (except that there is no gradient slew rate limitation). Use of improved q-space techniques can lead to a substantial reduction (e.g., of at least 40%) in the data acquisition time of DSI data without a significant degradation in angular resolution.

In other aspects, the subject innovation can integrate efficient q-space sampling trajectories with the use of non-coherent sparse q-space sampling and multi-band reception imaging techniques. Combining improved q-space techniques together with compressed q-space sampling and multi-band reception can lead to an additional reduction (e.g., of at least 40%) in the data acquisition time of DSI data without a significant degradation in image quality Improved q-space sampling per unit time used in conjunction with compressed q-space sensing and multi-band reception techniques, as well as the nature and relevance of the non-coherent artifacts that might develop, is discussed in greater detail below.

Referring initially to the drawings, FIG. 1 illustrates a methodology 100 of applying an MRI pulse sequence. This sequence can be acquire diffusion weighted imaging data via acquisition of multiple q-space samples in a single repetition time (TR), in accordance with an aspect of the innovation. While, for purposes of simplicity of explanation, the one or more methodologies shown herein, e.g., in the form of a flow chart, are shown and described as a series of acts, it is to be understood and appreciated that the subject innovation is not limited by the order of acts, as some acts may, in accordance with the innovation, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the innovation.

Methodology 100 can begin at 110 by applying a first radio frequency (RF) excitation for a sequence associated with a repetition time (TR), to excite a set of nuclei for diffusion weighted imaging (in most medical imaging, these nuclei will be hydrogen nuclei, although they need not be). At 120, a first diffusion preparation (DP) can be applied to the set of nuclei during the TR, followed by, at 130, application of a first signal readout (e.g., of substantially any variety, such as echo planar imaging as discussed in connection with experiments herein, or other methods of signal readout as would be apparent to a person of skill in the art, such as but not limited to spiral, multishot, etc.) of the set of nuclei during the first TR to obtain diffusion data associated with a first location in q-space. At 140, a second diffusion preparation (DP) can be applied during the TR, followed by, at 150, second signal readout that can be applied during the first TR to obtain diffusion data associated with a second location in q-space. At 160 and 170, one or more optional additional pairs of DP and signal readout can be applied to obtain third or subsequent readouts during the TR, optionally by repeating steps 160 and 170 more than once. Only the first RF excitation is required per TR (although more may optionally be used)—no RF excitation is required between the first signal readout and the second DP (or second signal readout and third DP, or third signal readout and fourth DP, etc.), as explained in greater detail below. Image acquisition can continue by returning to act 110 to apply a second RF excitation associated with a second TR, and repeat until data associated with a desired number of directions has been acquired. Imaging employing method 100 or a q-space trajectory (e.g., sampling more than one point in q-space per TR) such as described in connection with method 100 can be employed in conjunction with some, none, or all of the additional techniques described herein, such as a radial raster, stimulated echo or hybrid diffusion weighted (DW) sequences, compressed sensing, multi-band excitation, etc. Additionally, data acquired via method 100 or as described elsewhere herein can be employed in any setting in which DW MRI can be used, including but not limited to white matter tractography (e.g., HDFT).

What follows is a more detailed discussion of certain systems, methods, and apparatuses associated with aspects of the subject innovation. To aid in the understanding of aspects of the subject innovation, theoretical analysis and experimental results associated with specific experiments that were conducted are discussed herein. However, although for the purposes of obtaining the results discussed herein, specific choices were made as to the selection of various aspects of the experiments and associated setups—such as the specific imaging device(s) used, experimental parameters such as relevant times and other values (e.g., b-values, etc.), and choice of anatomical regions of study—the systems and methods described herein can be employed in other contexts, as well. For example, various aspects of the subject innovation can be utilized to obtain HDFT or other white matter tractography imaging data in substantially reduced time when compared with conventional techniques. In some embodiments, different selections of imaging devices, analytical techniques, or anatomical regions of study can be selected than those used in the experiments discussed herein, and may have differing characteristics, as explained in greater detail below.

Experimental results discussed below evaluate the accuracy of the q-space sampling schemes discussed herein. The accuracy of the techniques described above was evaluated in a number of ways, such as by comparing the conventional DSI orientation distribution functions (ODF) with those obtained using improved q-space sampling techniques. In situ scanning was used to minimize confounds from the tissue fixation process. The experimental results confirm that ODF's derived from improved q-space sampling schemes provide comparable angular resolution to those derived from conventional DSI scans.

Diffusion weighted MRI (DWMRI) has evolved into a powerful, non-invasive, imaging tool for the assessment of brain microstructure in vivo. This evolution arose from early observations of the sensitivity of nuclear magnetic resonance (NMR) to the compartmentalization of water molecules. This sensitivity was later incorporated into imaging sequences and led to the introduction of powerful techniques such as diffusion tensor imaging (DTI), Q-ball imaging (QBI), High Angular Resolution Diffusion Imaging (HARDI) and Diffusion Spectrum Imaging (DSI). These techniques can prospectively exploit the aforementioned compartment sensitivity to map out the angular dependence of the motion of water molecules in the brain on a voxel-by-voxel basis. This information can combined with streamline algorithms and appropriate boundary conditions to produce a volumetric rendition of the brain's long-range axonal structure. Though the anatomical accuracy of such a rendition is a subject of much investigation in the field, the lack of other means to obtain such information, in vivo, has led to its application for a variety of research, and more recently, clinical applications.

Among the methods for assessing water diffusion in the brain, DSI has slowly emerged as a powerful, time-consuming, but preferred, option because of its general approach (e.g., no a priori model) for representing the water diffusion in the brain. In DSI, the ability to provide model-free information about water diffusion stems from the relationship between the DWMRI signal and the Fourier Transform of the water displacement function, as shown in Equation 1:

$$S(\vec{k}, \vec{q}) = \int \rho(\vec{r}) (\int p_\Delta(\vec{r}, \vec{R}) e^{-i\vec{q} \cdot \vec{R}} d\vec{R}) e^{-i2\pi \vec{k} \cdot \vec{r}} d\vec{r} \qquad (1)$$

where $\vec{R}$ is the water displacement, $\vec{r}$ is the spatial position and $\vec{q} = c\gamma\vec{G}$ is the diffusion weighting vector ($c = \sqrt{(\Delta - \delta/3)}$ for a conventional spin-echo DW MRI sequence).

Physically, the water displacement function $p_\Delta(\vec{r}, \vec{R})$ represents the probability that within the diffusion time $\Delta$, a water proton would move a distance $\vec{R}$ within the voxel. When this probability is compiled across a range of displacement distances (radial integration on $\|\vec{R}\|$), the orientation distribution function (ODF) is obtained and the maxima of the ODF thus provide information about the preferential directions of motion (angles) within the voxel. Therefore, if images with different diffusion weightings are collected, then the 3D Fourier transformation of the signal intensities (arranged in "q-space" according to their diffusion weighting vector $\vec{q}$) for a specific voxel provides an estimate of the ODF at that spatial location.

Figure 2:
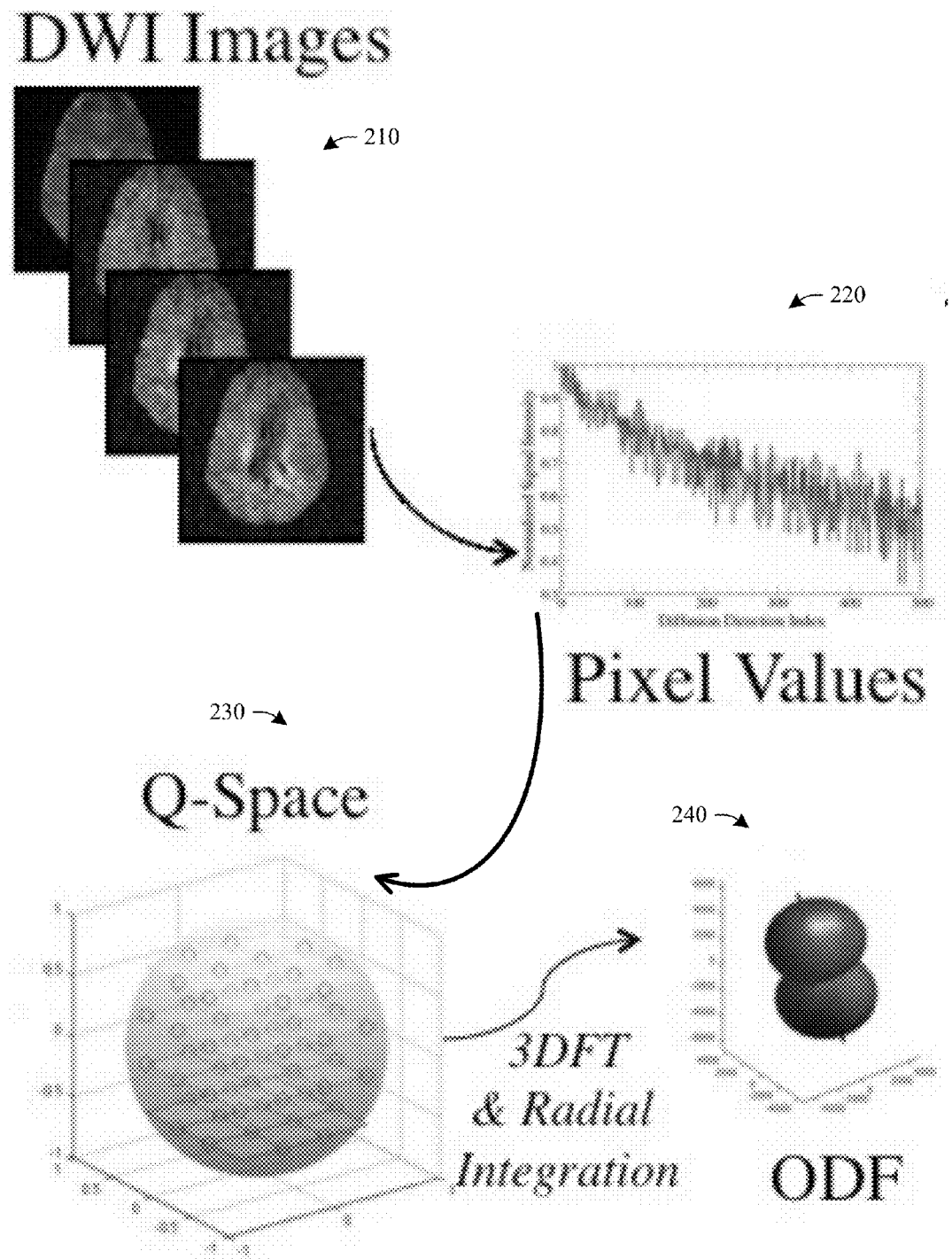
FIG. 2 illustrates the determination of the water displacement function (i.e., orientation diffusion function (ODF)) from diffusion weighted (DW) images.

FIG. 2 illustrates the determination of the water displacement function (i.e., ODF) from diffusion weighted (DW) images at 210. For a specific voxel, the signal intensities corresponding to the images acquired for each value of q at 220 can be arranged into a 3D Cartesian grid at 230. The 3D Fourier transform of this data, followed by radial integration, provides an estimate of the ODF at that voxel, as seen at 240. From the ODF data, fiber tracking can be performed.

Figure 3:
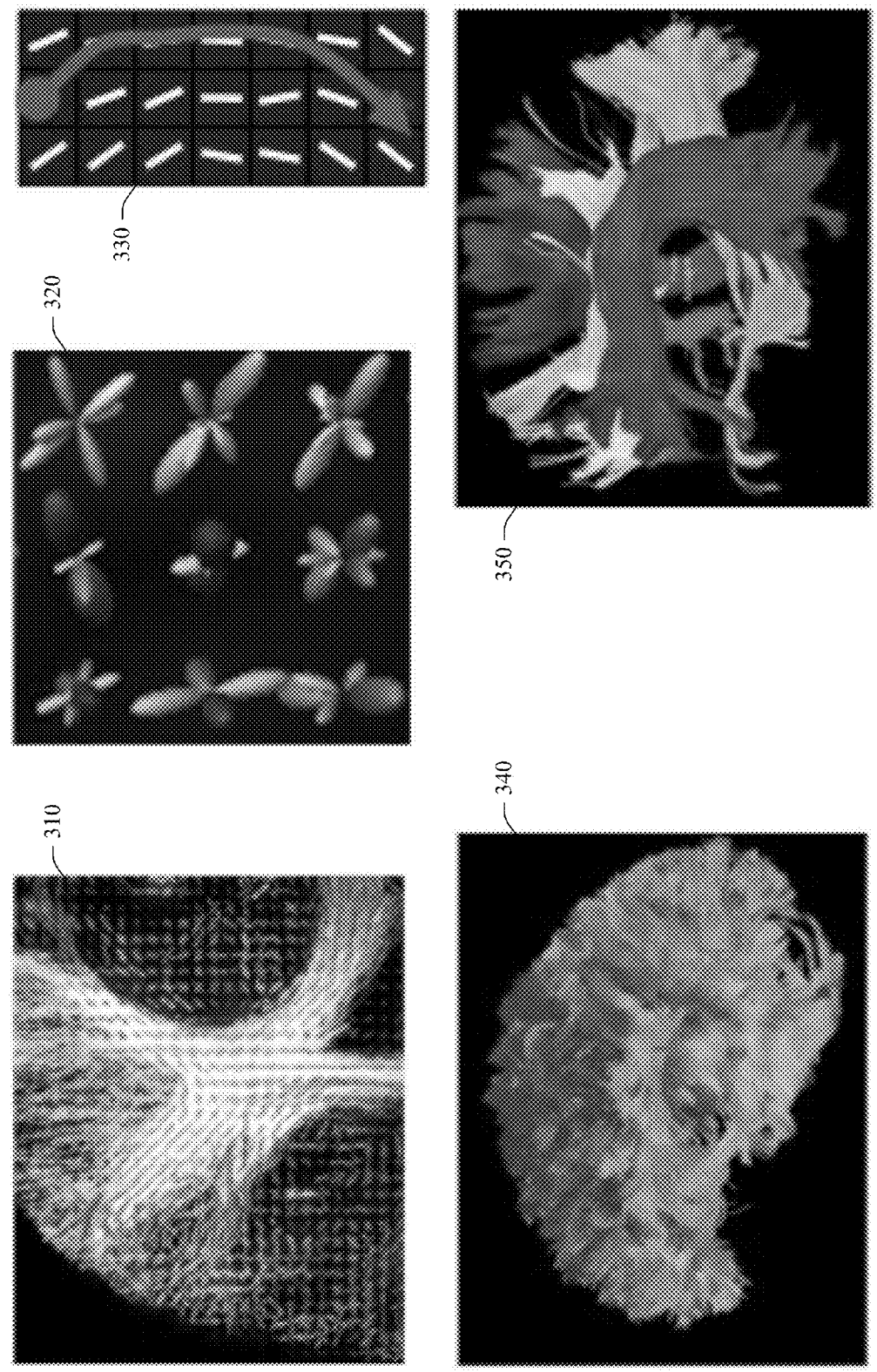
FIG. 3 illustrates a pictorial depiction of the high definition fiber tracking (HDFT) process.

FIG. 3 shows a pictorial depiction of the HDFT fiber tracking process. Once this process is completed for every voxel in the brain, such as shown at 310, the preferential directions of motion for each voxel can be identified from the peaks (maxima) of the ODF as seen at 320, and can be tracked across space to provide an estimate of the brains fiber architecture. As shown in 330, these directions can be followed across neighboring pixels to obtain the brain "tractogram," with an example shown at 340. Tract segmentation can then used to parcellate the fiber bundles in an anatomically consistent fashion, such as shown at 350. The tracking of this long-range structural information across the volume of the human brain in a consistent and accurate fashion is the basis of the High-Definition Fiber Tracking (HDFT) algorithm. The reliability and reproducibility of the findings provided by this algorithm has revolutionized approaches towards the understanding of the brain's long-range axonal structure and, as illustrated below, has also provided unique insights for the treatment and monitoring of challenging pathologies in the brain.

The HDFT algorithm, which the pulse sequences and image acquisition techniques of the subject innovation can be used to facilitate, is a significant advance over conventional white matter tractography. The introduction and development of functional MRI (fMRI) more than twenty years ago has provided a wealth of "relational" information about functionally specialized areas of the brain. Using fMRI, it has also been demonstrated that many brain pathologies have their own functional signatures and that such signatures can sometimes be affected by therapeutic interventions. The relationship between such functional signatures and the underlying long-range axonal structure of the brain has not, however, been studied at nearly the same level, despite the fact that DWMRI was introduced many years before fMRI. This is due in large part to many of the methodological challenges posed during the fiber tracking process, which have not been properly addressed by acquisition and reconstruction algorithms until the development of HDFT. These challenges include, notably: (1) following fiber tracts from known origins to cortical terminations; (2) resolving multiple intra-voxel fiber crossings and; (3) data acquisition times that are too long for clinical use when accurate and reproducible results are required. Each of these challenges are solved by aspects of the subject disclosure.

As discussed below, the HDFT algorithm is capable of addressing the first two challenges, and the results obtained through its use provide novel insights into difficult to diagnose central nervous system (CNS) disorders as well as challenging surgical procedures. Aspects of the subject innovation related to novel pulse sequences and q-Space trajectories, addresses the last challenge noted above.

To achieve the levels of angular and intravoxel crossings resolution used to date, the HDFT algorithm requires the use of high-angular resolution DSI data that, when using the conventional Cartesian raster, leads to a total of 257 images per slice being acquired. All examples presented in this section were acquired on a 3T Tim Trio System (Siemens) using a 32-channel coil and a "free-form", twice-refocused echo-planar imaging (EPI) spin echo sequence (TR/TE (where TE is the echo time)=9916/157 ms, 2.4×2.4×2.4 mm3, b−max=7,000 s/mm2) (although it is to be understood that specific parameters and techniques (e.g., sequences selected, such as but not limited to readout sequence) may be varied). ODF's were reconstructed using a Generalized Q-Ball Imaging (GQI) approach with 321 discrete sampling directions for each voxel and a mean diffusion distance of 0.5 to 1.2 mm. Fiber tracking was performed using the DSI-Studio interface and tracts generated using an ODF-streamline version of the fiber assignment by continuous tracking (FACT) algorithm. Tracking was initiated via random seeding from within a seed mask with fiber progression continuing along the direction of the major fiber with a step size of 0.5 to 1.2 mm (minimum fiber length of 0-20 mm, turning angle threshold of 60°) and terminated when the relative fractional anisotropy (FA) of the incoming fiber dropped below a preset threshold (0.03-0.06) or exceeded the turning angle threshold. Track consistency was achieved by weighting the directional estimates (20% from the previous moving direction and 80% by the incoming direction). Segmentation of the fiber tracts was performed using Track-Vis software.

Figure 4:
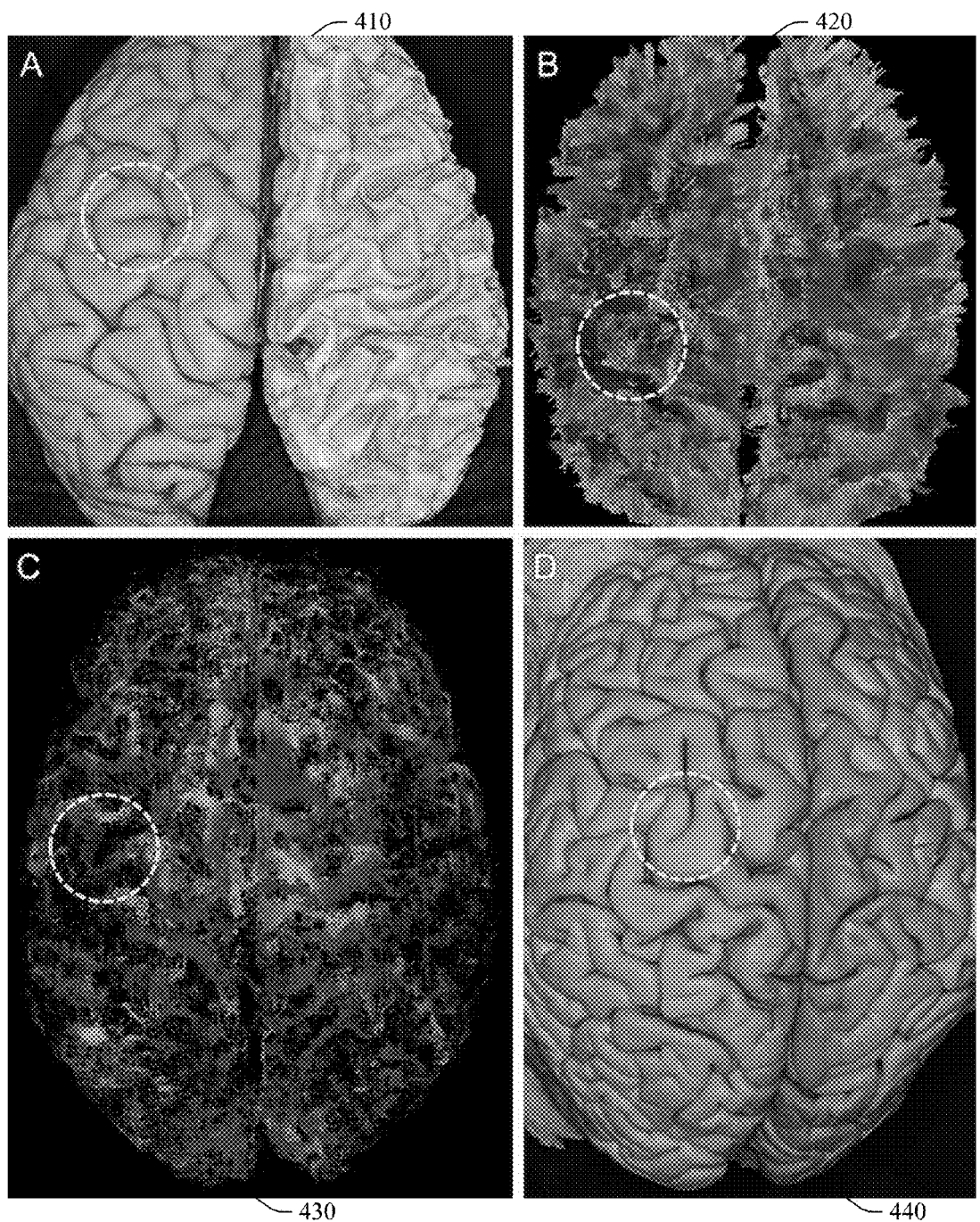
FIG. 4 illustrates HDFT's ability to follow fiber tracks to their cortical terminations.

FIG. 4 illustrates HDFT's ability to follow fiber tracks to their cortical terminations. An image of a whole brain is presented at 410, and corresponding tractographic reconstructions of the whole brain is shown at 420 (average 250,000 streamlines), with the corresponding tract terminations in the cortical surface shown in 430. Image 430 illustrates how the cortical terminations of the HDFT tractograms reproduce the gyral morphology of the specimen presented in image 440. In the cortical termination image 430, fibers that are successfully tracked onto the cortical surface are depicted on the outer surface of the cortex. Note that the fibers fill up most gyri and leave the gap for the sulci, thus resembling normal cortical anatomy seen in 410 and 440. Most gyri and sulci are easily recognized based solely on the endpoints of the fiber tracts, which faithfully replicates the intricate pattern of cortical folding.

The Centrum Semiovale is defined as the common central mass of white matter with an oval appearance in horizontal sections of the brain just above the level of the lateral ventricles. Previous anatomical and DTI studies have shown that this is a highly complex region of the white matter composed from lateral to medial by the arcuate and superior longitudinal fascicles (anteroposterior orientation), corona radiata (craniocaudal orientation), and corpus callosum fibers (mediolateral orientation).

Figure 5:
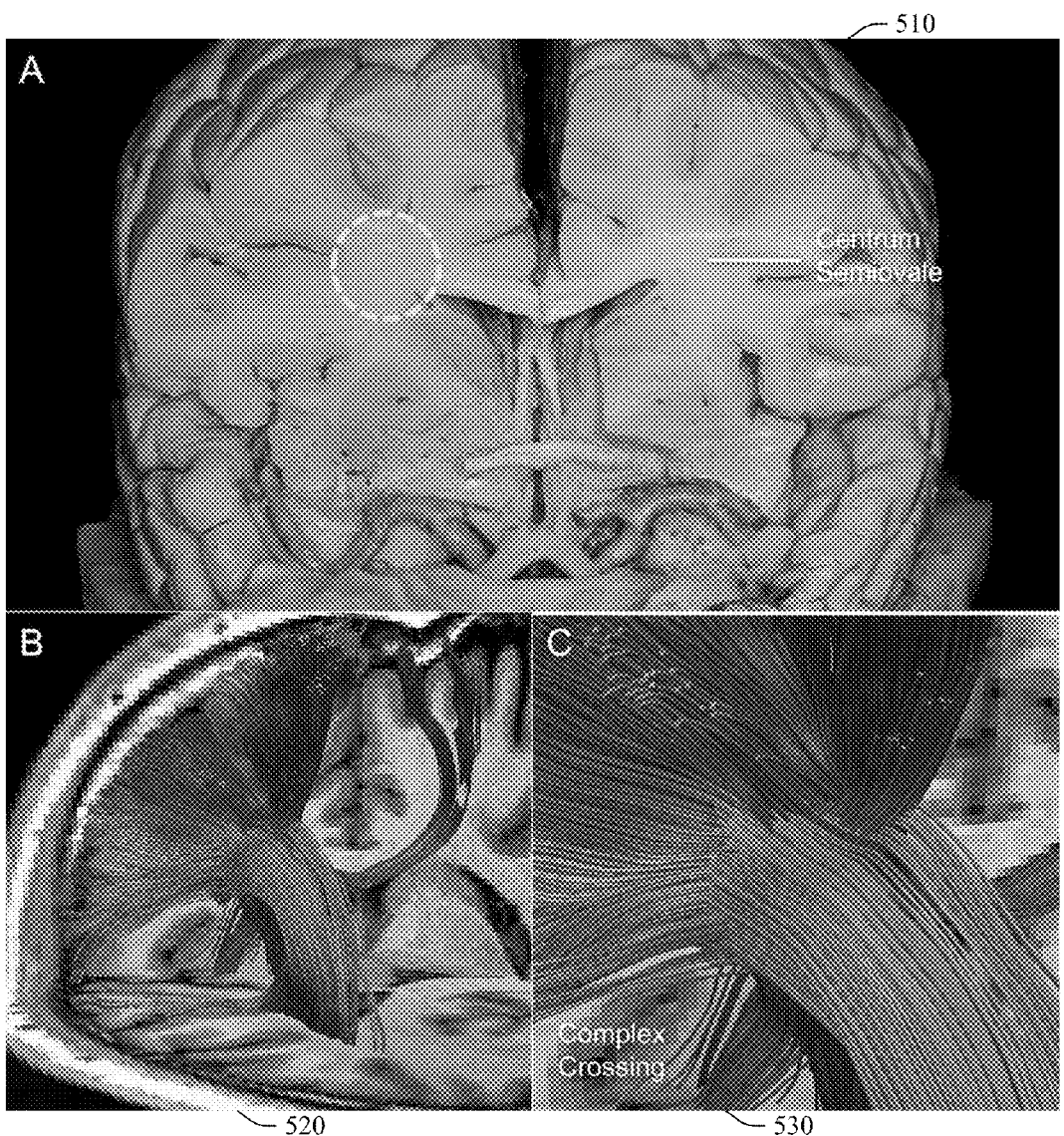
FIG. 5 illustrates a cross section of a brain, indicating the centrum semiovale, and corresponding MRI images with overlayed tract data generated via HDFT.

At the centrum semiovale, these groups of fibers cross each other in three spatial planes. This triad of complex fiber crossings severely limits other fiber-tracking techniques, such as DTI. However, as shown in FIG. 5, HDFT is capable of resolving these complex crossings, as the radiating fibers of the corpus callosum are followed when they cross, from medial to lateral, the vertical fibers of the coronal radiata and the horizontal fibers of the arcuate and superior longitudinal fascicles. Similarly, the fibers of the corona radiata and arcuate/superior longitudinal fascicles can be followed through these complex crossings without missing any significant volume of fibers. FIG. 5 shows a cross section of a brain at 510, indicating the centrum semiovale, and corresponding MRI images at 520 and 530 with overlayed tract data generated via HDFT.

Figure 6:
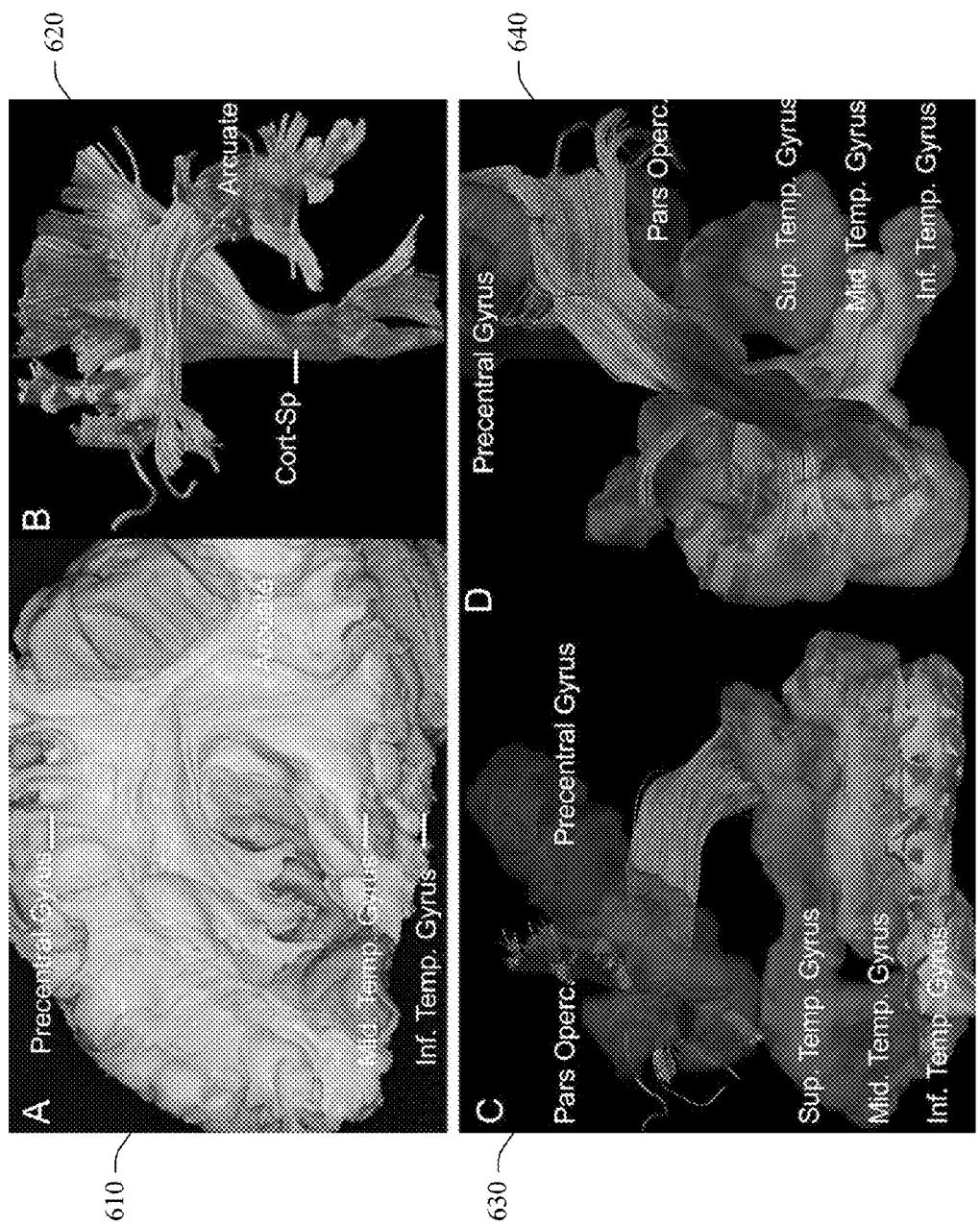
FIG. 6 illustrates functional segregation of the corticospinal tract and the arcuate fasciculus with HDFT.
Figure 7:
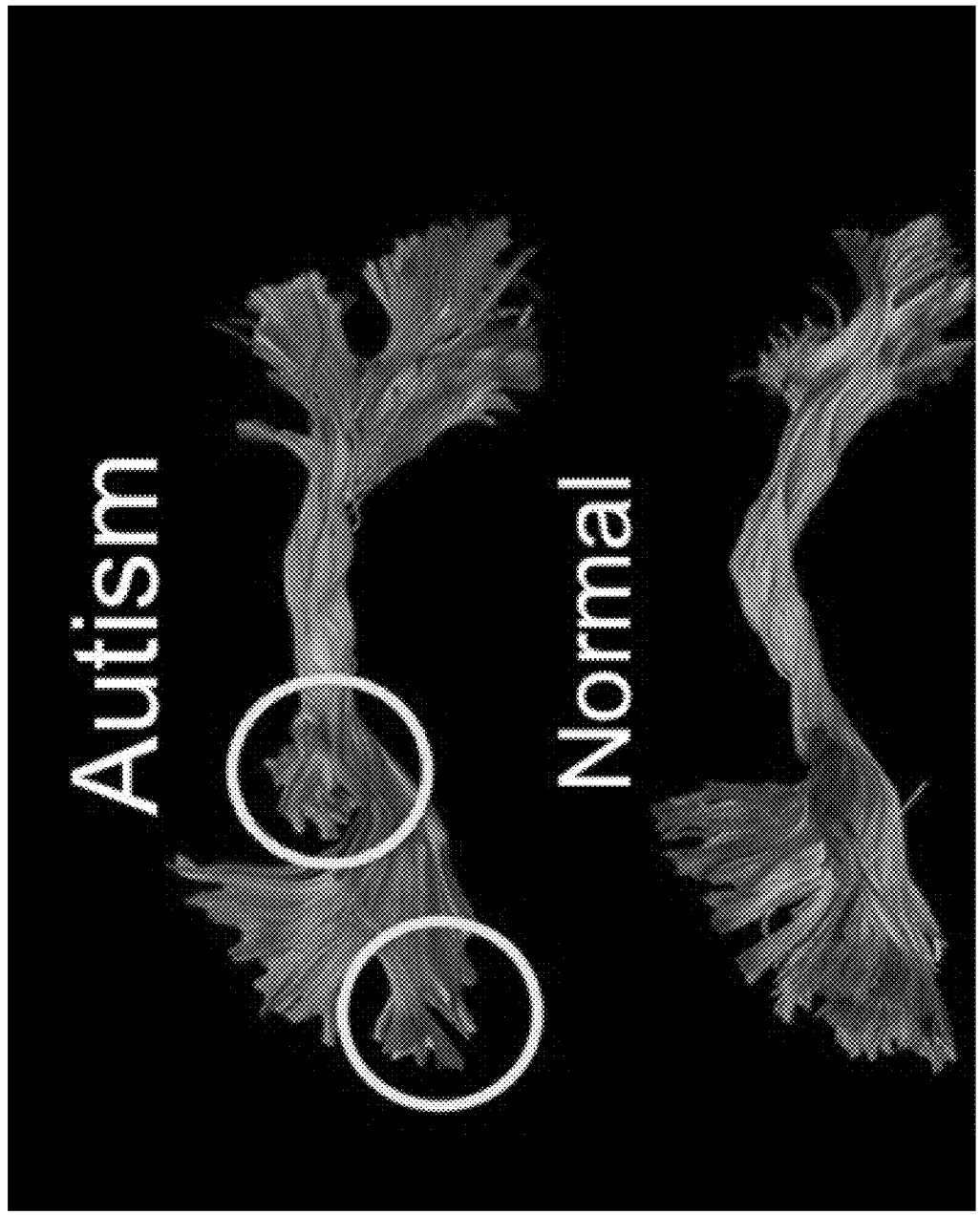
FIG. 7 illustrates anatomical differences in the arcuate fascicle between a high-functioning autistic subject and an age-matched control.

The Arcuate Fascicle is described as a reversed C-shaped structure that surrounds the insula and interconnects the frontal and temporal lobes. Fiber dissection as well as fiber tracking studies have investigated the cortical areas interconnected by the arcuate fascicle. Given their technical constraints, these attempts have provided an approximation or estimation of interconnected cortical regions that are largely based upon a priori anatomical knowledge rather than direct visualization. As shown in FIG. 6, which illustrates functional segregation of the corticospinal tract and the arcuate fasciculus with HDFT, HDFT allows visualization of the different branches of the arcuate fascicle at the frontal and temporal regions. FIG. 6 shows a cross-sectional image of a brain at 610, with corresponding tractographic images illustrating segregation at 620, 630, and 640. These terminal branches can be followed into their particular gyri/sulci of origin or destiny. Moreover, fibers of the arcuate fascicle can be tracked from one specific gyms in the frontal region, such as pars opercularis, to its temporal counterpart, such as the posterior segment of the inferior temporal sulcus and middle temporal gyms. The superposition of segmented cortical areas facilitates the analysis of the pattern of fiber terminations of the arcuate fascicle, revealing a much more complex and rich scheme than previously stated, and confirming the laterality of the arcuate tract and its relation to language function. This particular set of findings has tremendous implications for the study of complex behavioral pathologies such as autism, where there is emerging evidence of significance differences in the underlying white matter tracts. This particular finding is illustrated in FIG. 7, which illustrates anatomical differences in the arcuate fascicle between a high-functioning autistic subject and an age-matched control. Clearly, there are anatomical differences that demand further investigation. However, the study of such a challenging subject pool with HDFT is currently limited by the requirement of remaining still during a 45 minute scan and can thus receive tremendous benefit from various aspects of the subject innovation (e.g., novel image acquisition techniques discussed herein).

Results discussed below applied HDFT to the pre- and postsurgical study intracerebral lesions. The results presented here illustrate the new and clinically relevant information that HDFT could provide for patient care when assessing "anatomically silent" tissue damage and considering difficult surgical procedures for the treatment of low-grade gliomas. Although the clinical decision-making was not prospectively affected by the HDFT scans, the analysis of the pre- and post-surgical information was instrumental for the final interpretation of the clinical findings.

Figure 8:
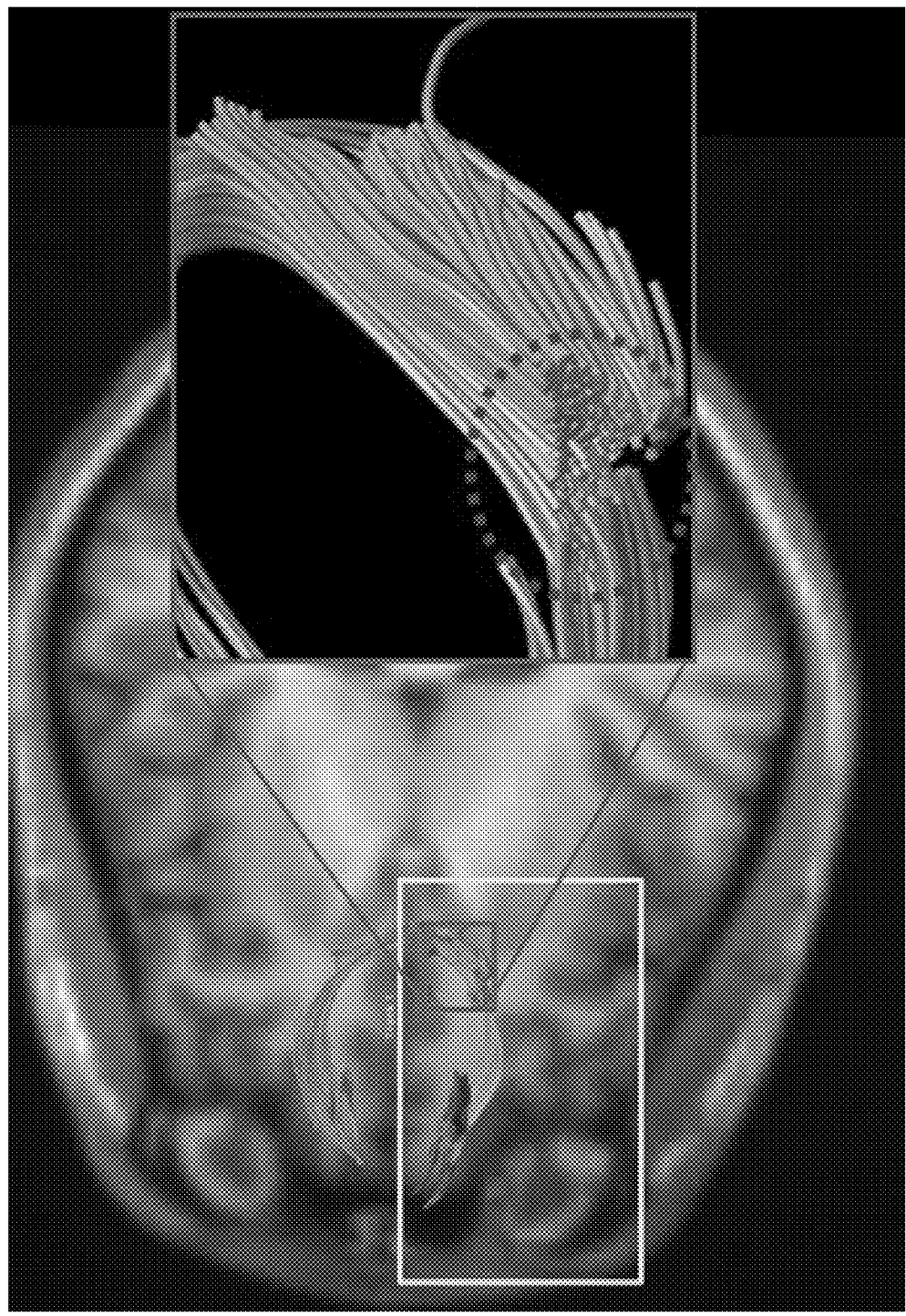
FIG. 8 illustrates an example HDFT image of a TBI subject.

Traumatic brain injury (TBI) presents a number of yet-unanswered imaging questions. Although there is consistent evidence that axonal injury does take place acutely during TBI, there is very little "actionable" information that can be currently derived from conventional neuroimaging scans. FIG. 8 illustrates an example HDFT image of a TBI subject, a football player diagnosed with an acute concussion after a helmet-to-helmet impact during a game. The subject remained symptomatic for three weeks during which no evidence of brain tissue damage and/or edema was apparent in the initial as well as follow up conventional scans. The acute HDFT scan, on the other hand, revealed an apparent break in the posterior aspect of the left side of the formix, as shown in the magnified portion of FIG. 8. Quantification of the streamlines revealed a 67% decrease in the number of continuous fibers when compared to the contralateral side.

Low-grade gliomas, another potential application of the subject innovation, have the best prognosis among all intracranial malignant neoplasms that are treated in the United States. Although the incidence of low-grade gliomas is low (<30% of malignant intracranial neoplasms), the mean survival time often exceeds 10 years. Therefore, for the tumors where surgical resection is prescribed, preservation of function is paramount in order to ensure improved post-operative quality of life. The surgical dilemma when dealing with low-grade gliomas is, therefore, whether there are any fibers (in particular functional fibers) within the tumor or not, and what is the architecture and function of the white matter that surrounds the tumor. Preliminary analysis suggests that HDFT may provide unique insights into these questions. Grossly, low-grade gliomas can be classified as focal, when they grow within a single gyms, or diffuse, when they affect several gyri and sulci. In the focal gliomas (from the limited number studied in connection with the subject innovation, given their much lower incidence), HDFT has repeatedly shown the complete absence of fibers within the tumor tissue. Interestingly, the fibers that would normally occupy the tumor space are displaced in such a way that they form the margins of the tumor. The limited studies with diffuse low-grade gliomas suggest that, as with focal gliomas, there are no fibers within focal portions of the tumor (for instance, within a particular gyms), but secondary to the diffuse expansion of the tumor, fiber tracts become trapped in between focal portions of the tumor (for instance, in between adjacent gyri). These observations support the hypothesis that low-grade gliomas mostly grow in between the fibers tracts, following their same pathway, rather than within the fiber tracts.

Figure 9:
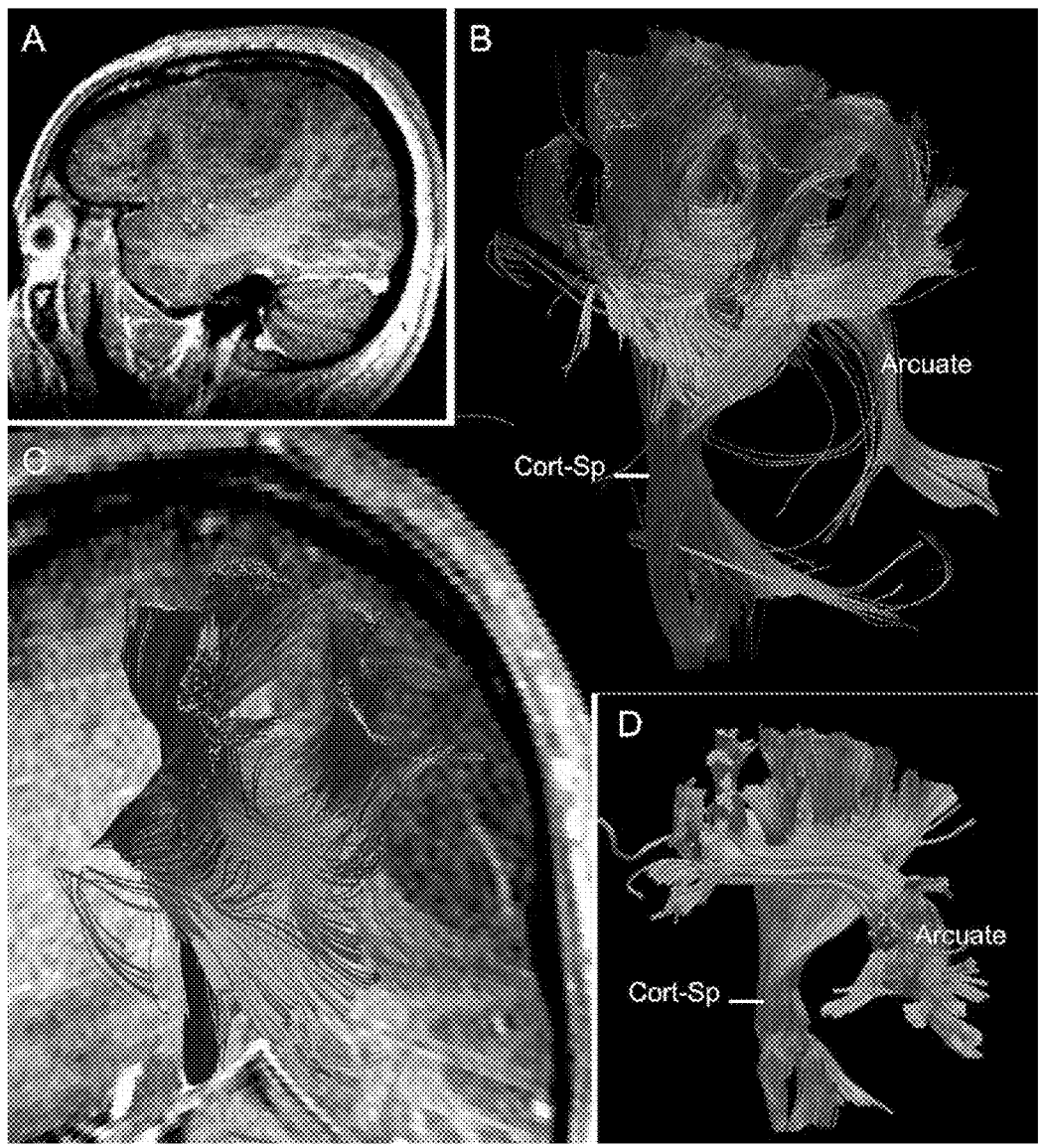
FIG. 9 illustrates HDFT and contrast-enhanced MRI results from a subject with a superior parietal lobe low-grade glioma.

FIG. 9 illustrates these observations, showing HDFT and contrast-enhanced MRI results from a subject with a superior parietal lobe low-grade glioma. The images correspond to a 28 year-old male patient that presented with an epileptic seizure (otherwise asymptomatic). An MRI study showed a diffuse low-grade glioma infiltrating several gyri: inferior frontal gyms (pars opercularis), posterior portion of the middle frontal gyms, and most lateral portion of the precentral gyms. The HDFT study showed displacement of the short intergyral fibers trapped within the tumor. The tumor appeared to follow the same pathway as the arcuate tract, but rather than disrupting this fiber tract, the tumor mass displaced down the main stem of the frontal portion of the arcuate tract and pushed away the branches of the arcuate tract that interconnect the inferior frontal gyms (pars opercularis), posterior middle frontal gyms, and lateral portion of the precentral gyms. Complete resection of this tumor would entail resection of the trapped intergyral fibers, and significant risk for arcuate tract damage. The pyramidal tract, however, was completely spared by the tumor.

The examples and results discussed above illustrate how the availability of high angular resolution in HDFT allows imaging and visualizing the long-range axonal structure of the brain in a robust and consistent fashion and how such visualization can provide novel insights into "connection diseases" (e.g., autism) as well as chronic and acute neurological presentations that posed treatment challenges. However, HDFT scans using conventional image acquisition techniques face long data acquisition times. As discussed below, the limited gradient strength available on clinical scanners puts severe constraints on the maximum radius that can be reliably sampled in q-space. Under such conditions, increasing the b-value is not a viable option in order to increase the quality of the scans and/or decrease the data acquisition time. However, in accordance with aspects of the subject innovation, when the maximum b-value is limited by the hardware, increased angular resolution can be obtained through angular oversampling of a radial grid without increasing the data acquisition time. Conversely, for a target angular resolution, this approach allows such target to be reached in a lower data acquisition time.

One of the corollaries of Equation 1 above is that the angular resolution of the ODF, i.e., its ability to resolve and properly assign fiber directions within a voxel, is directly related to the angular separation between the samples of the ODF obtained in displacement space (i.e., R-space). Because a Cartesian grid is used in conventional implementations of DSI, this separation is directly proportional to the spatial resolution ($\Delta R$) of the ODF in R-space, or conversely, the inverse of the largest q-value ($q_{max}$) sampled during data acquisition. The number of images $N_S$ required to estimate the water displacement function with resolution $\Delta R=1/q_{max}$ over a volume $R^3_{max}=1/\Delta q^3$ is then as shown in Equation 2:

$$N_C = \frac{4\pi}{6}\left(\frac{1}{\Delta\theta}\right)^3 \qquad (2)$$

(half the volume of a sphere of radius $1/\Delta R$ divided by $\Delta R^3$). Therefore, improving the angular resolution using DSI on a conventional Cartesian grid is an $n^3$ problem and leads to an 8-fold increase in the number of required images per slice every time that the angular resolution is doubled.

This scaling of the number of required images with the desired angular resolution leads to long scans that are not well suited for routine clinical use (or large scale investigation and characterization of the technique) due to their increased motion sensitivity, poor patient tolerance and challenging logistical throughput. These latter features render implementation of HDFT using conventional image acquisition less than ideally suited for carrying out much needed anatomical validation and reproducibility studies in humans. Means to speed up the acquisition of the underlying q-space data are therefore helpful in order to further investigate the robustness and reproducibility of HDFT, as well as facilitating routine use in a clinical environment.

In one aspect of the subject innovation, one means to exploit the geometry required for the angular evaluation of the ODF and speed up the HDFT scans is to use a radially symmetric sampling raster. When such a raster is used, the sampling requirements are quite different, as the effective angular resolution is proportional to the separation between the samples collected on the surface of the unit sphere. The number of such samples is given by Equation 3:

$$N_R = 4\pi \left(\frac{1}{\Delta\theta}\right)^2 \quad (3)$$

Therefore, if all q-space samples along the path taken to reach the surface of the sphere can be acquired in a single readout, as discussed below and in accordance with aspects of the subject innovation, the number of acquisitions required to double the angular resolution in 3D only needs to increase by a factor of four. Further, the requirement of all collinear q-space samples to be acquired in a single readout is geometrically favored when a radial raster is used, because each q-space point is traveled sequentially in time as the duration of the diffusion gradients is extended. The same strategy is harder to implement for a Cartesian raster, as only a fraction of the points in q-space can be aligned in such a sequential fashion. Strategies to sample multiple q-space points along radial trajectories are described and demonstrated below in accordance with various aspects of the innovation.

Figure 10:
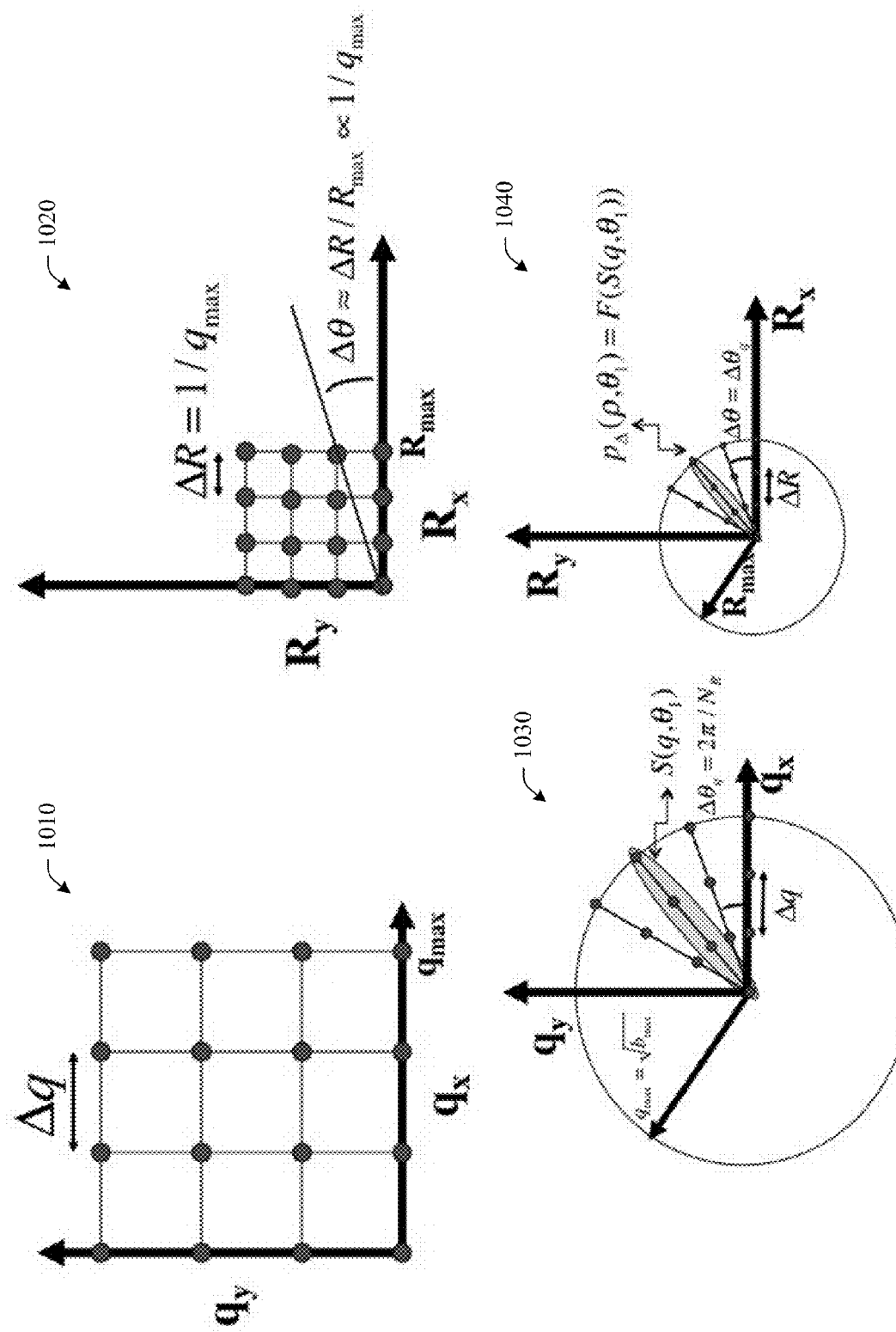
FIG. 10 illustrates the relationship between the angular resolution and the pixel size in the Cartesian and radial grids.

FIG. 10 illustrates the relationship between the angular resolution and the pixel size in the Cartesian and radial grids (shown in 2D instead of 3D for simplicity). As seen in 1010 and 1020, for a Cartesian grid, a higher angular resolution requires a larger radius in q-space. On a Radial grid, however, higher angular resolution can be achieved without increasing the b-value by angular oversampling of a circle of radius $\sqrt{b_{max}}$, as shown in 1030 and 1040. In this setting, the projection slice theorem allows the direct conversion of radial samples (shaded oval) in q-space to radial samples at the same angular position in R-space.

Figure 11:
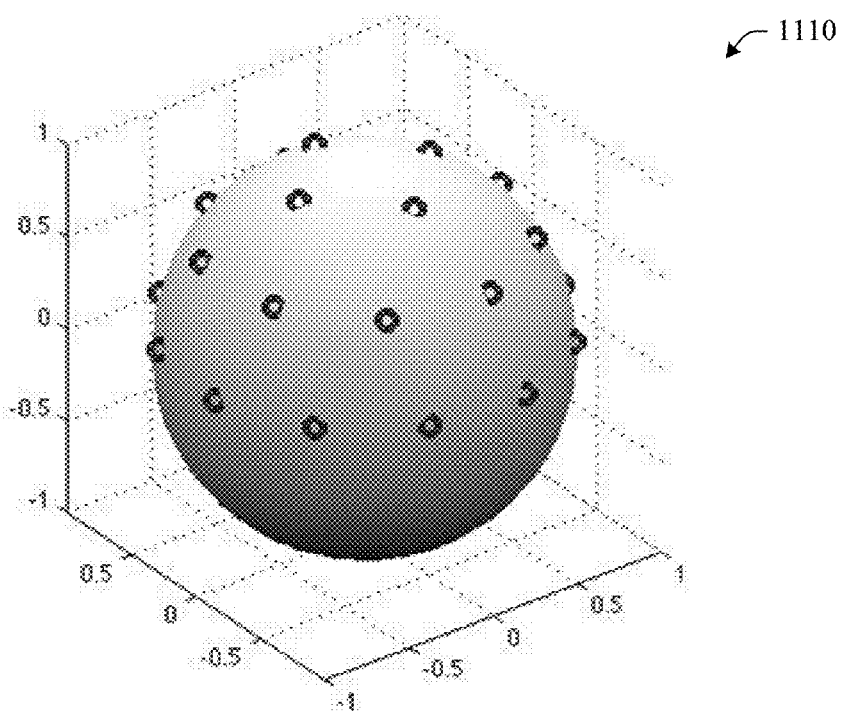
FIG. 11 illustrates the effect of doubling the angular resolution by angular oversampling of a surface of a sphere.
Figure 11:
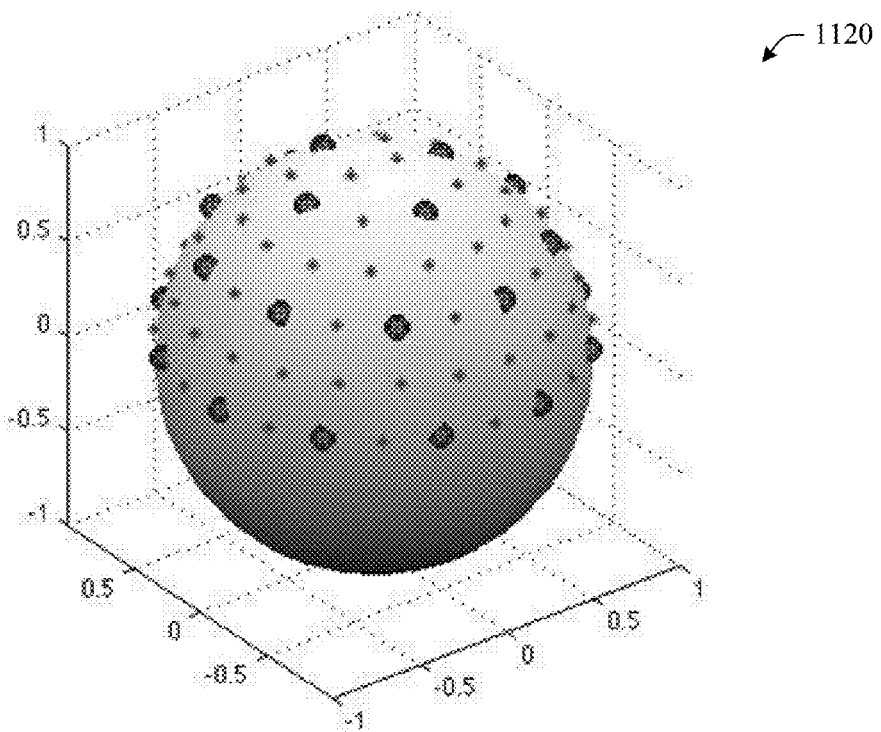

FIG. 11 illustrates the effect of doubling the angular resolution by angular oversampling of a surface of a sphere of radius $q_{max}=\sqrt{b_{critical}}$, shown in images 1110 (before doubling) and 1120 (after doubling). The number of required excitations needs to only increase by a factor of four, from 27 to 112 in this example.

As indicated above, one feature of the use of a radial raster for the acquisition of q-space data is that every angular direction sampled on the surface of the sphere in q-space leads to an independent (i.e., non-interpolated) value for the radial ODF at the same exact angular location on the surface of the sphere in R-space. In other words, the total number of angular samples for the ODF is equal to the number of intersections of the radial lines with the surface of the unit sphere. A theoretical demonstration of this finding is presented below.

First, for a particular spatial position $\vec{r}$, and direction ($\theta$, $\phi$), in the brain, the value of the ODF is defined as in Equation 4:

$$\text{ODF}(\vec{r},\theta,\phi) = \int p_\Delta(\vec{r},\rho\hat{u})\rho^2 d\rho \quad (4)$$

where $\hat{u}=(\cos\phi\sin\theta, \sin\phi\sin\theta, \cos\theta)$ is the unit vector in the direction specified by ($\theta$, $\phi$). The expression above is the weighted integral of the values of the water displacement function along a line through the origin in the direction of ($\theta$, $\phi$). Because of the projection slice theorem, the values of the water displacement function along this line are identical to the values of the one-dimensional Fourier transform of the Radon transform of the q-space samples along the same line, as shown in Equation 5:

$$p_\Delta(\vec{r},\rho\hat{u}) = \int_{\hat{u}} (R_{3D}S)(\vec{r},q\hat{u})e^{-i2\pi\rho q}dq \quad (5)$$

where $(R_{3D}S)(q\hat{u})$ is given by Equation 6:

$$(R_{3D}S)(q\hat{u}) = \int S(\vec{q}\,')\delta(\vec{q}\,'\cdot\hat{u}-q)d\vec{q}\,' \quad (6)$$

Figure 12:
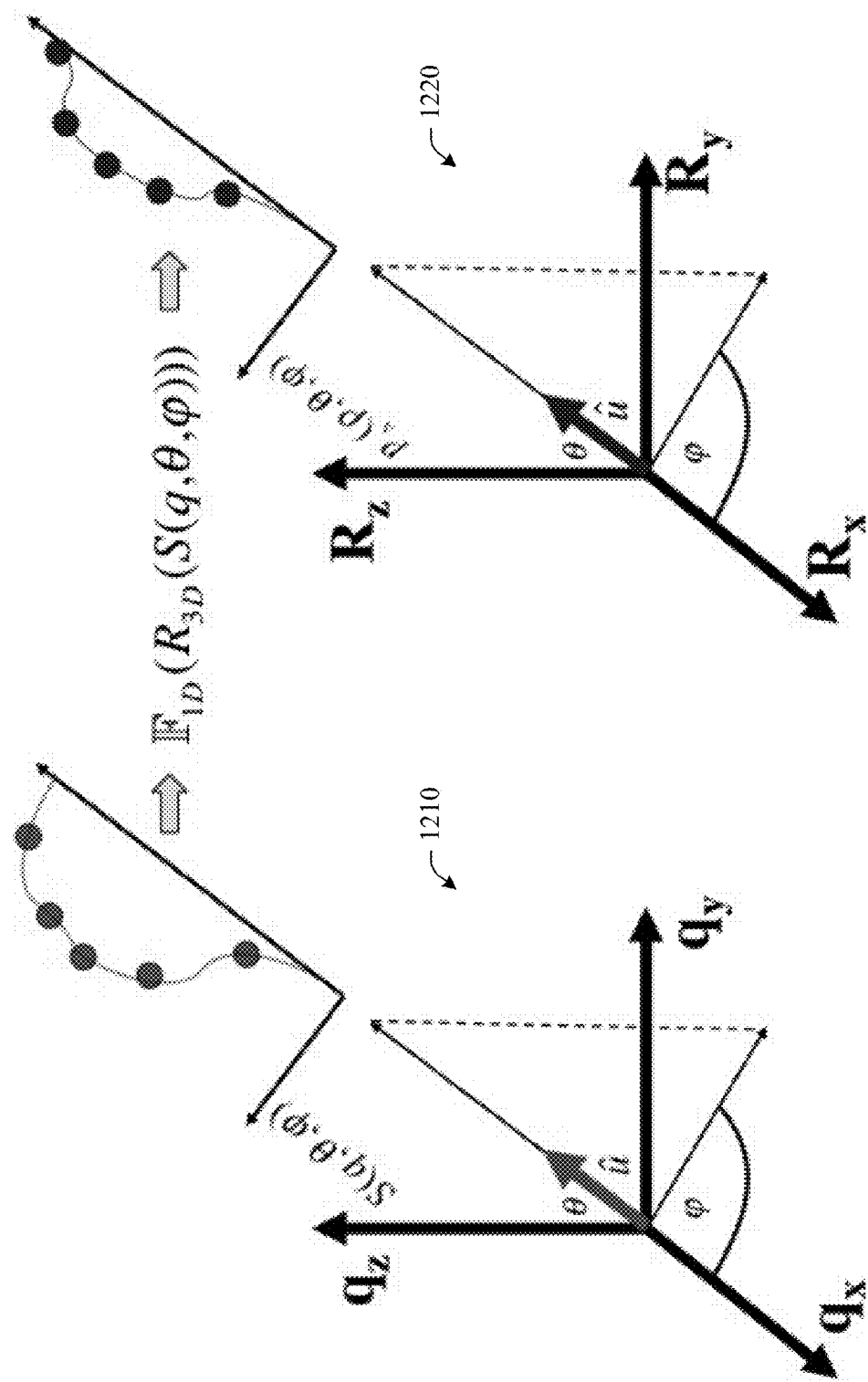
FIG. 12 illustrates the relationship between the sampling geometry in q-space and the sampling orientation in R-space when a radial raster is used.

FIG. 12 illustrates the relationship between the sampling geometry in q-space in 1210 and the sampling orientation in R-space 1220 when a radial raster is used. For a given angular direction, radial samples of the 3D Fourier transform for the ODF (measured data) can be directly transformed into radial samples of the ODF in R-space along the same angular direction, as illustrated graphically in FIG. 12.

By combining Equations 4 through 6, it can be shown that Equation 7 holds:

$$\text{ODF}(\vec{r},\theta,\phi) = \int S(\vec{q})F(\vec{q},\hat{u})d\vec{q} \quad (7)$$

where $F(\vec{q},\hat{u})$ is given by Equation 8:

$$F(\vec{q},\hat{u}) = \frac{R_m^3}{4}\left(\frac{\sin(2R_m\pi\vec{q}\cdot\hat{u})}{2R_m\pi\vec{q}\cdot\hat{u}} + \frac{2\cos(2R_m\pi\vec{q}\cdot\hat{u})}{(2R_m\pi\vec{q}\cdot\hat{u})^2} - \frac{\sin(2R_m\pi\vec{q}\cdot\hat{u})}{(2R_m\pi\vec{q}\cdot\hat{u})^3}\right) \quad (8)$$

and $R_m$ is the maximum displacement distance being probed. This last expression, being analytical, allows the calculation of the ODF through a direct matrix multiplication between the measured data ($S(\vec{q})$) and a geometric encoding matrix ($F(\vec{q},\hat{u})$).

Another corollary of this reconstruction algorithm is that improving the angular resolution, as required to improve the definition of the fiber crossings, does not necessarily require the use of larger b-values, but rather the acquisition of additional radial lines intersecting the surface of the sphere (essentially by angularly oversampling the gradient directions, which as discussed above is a $n^2$ problem). In addition, because the additional samples used to improve the angular resolution in such a fashion do not require the use of noisier, higher b-value data, the improvement in angular resolution does not come at the expense of lower signal-to-noise ratio (SNR) for the calculated ODF.

Advantages of the radial raster for the acquisition of q-space data can be illustrated using an analytical model for the diffusion data where the direction and properties of the fibers can be set a priori. In this analytical model, each brain voxel has a number N of fibers traversing through it with diffusivities ($\lambda_i^\perp$, $\lambda_i^\parallel$) volume fractions $f_i(\Sigma_{i=1}^N f_i)$, and orientations ($\theta_i$, $\phi_i$) ($i=1, 2, \ldots, N$). The corresponding signal $S(\vec{q})$ for that voxel is:

$$S(\vec{q}) = \sum_{i=1}^{N} f_i e^{-(\Delta-\delta/3)\vec{q}^T D_i \vec{q}} \quad (9)$$

where $$D_i = R(\theta_i, \varphi_i) \begin{pmatrix} \lambda_i^\perp & 0 & 0 \\ 0 & \lambda_i^\perp & 0 \\ 0 & 0 & \lambda_i^\| \end{pmatrix} \tag{10}$$

and $$R(\theta_i, \varphi_i) = \begin{pmatrix} \cos\varphi_i & -\sin\varphi_i & 0 \\ \sin\varphi_i & \cos\varphi_i & 0 \\ 0 & 0 & 1 \end{pmatrix} \begin{pmatrix} \cos\theta_i & 0 & \sin\theta_i \\ 0 & 1 & 0 \\ -\sin\theta_i & 0 & \cos\theta_i \end{pmatrix} \tag{11}$$

Using this analytical model, the q-space data for a two-fiber voxel with an isotropic water component ($f_0=0.2$; $f_1=0.4$; $f_2=0.4$; $D_0=\lambda_0 I$; $\lambda^\|=2\times10^{-3}$ mm²/s; $\lambda^\perp=\lambda^\|/10$; $\lambda_0=\lambda^\|/3$) can be generated and the effects of b-value and angular resolution illustrated. For the first set of simulations discussed below, an angular separation of 70 degrees was introduced between the two fibers (which without loss of generality can be assumed to lie on the x-y plane).

Figure 13:
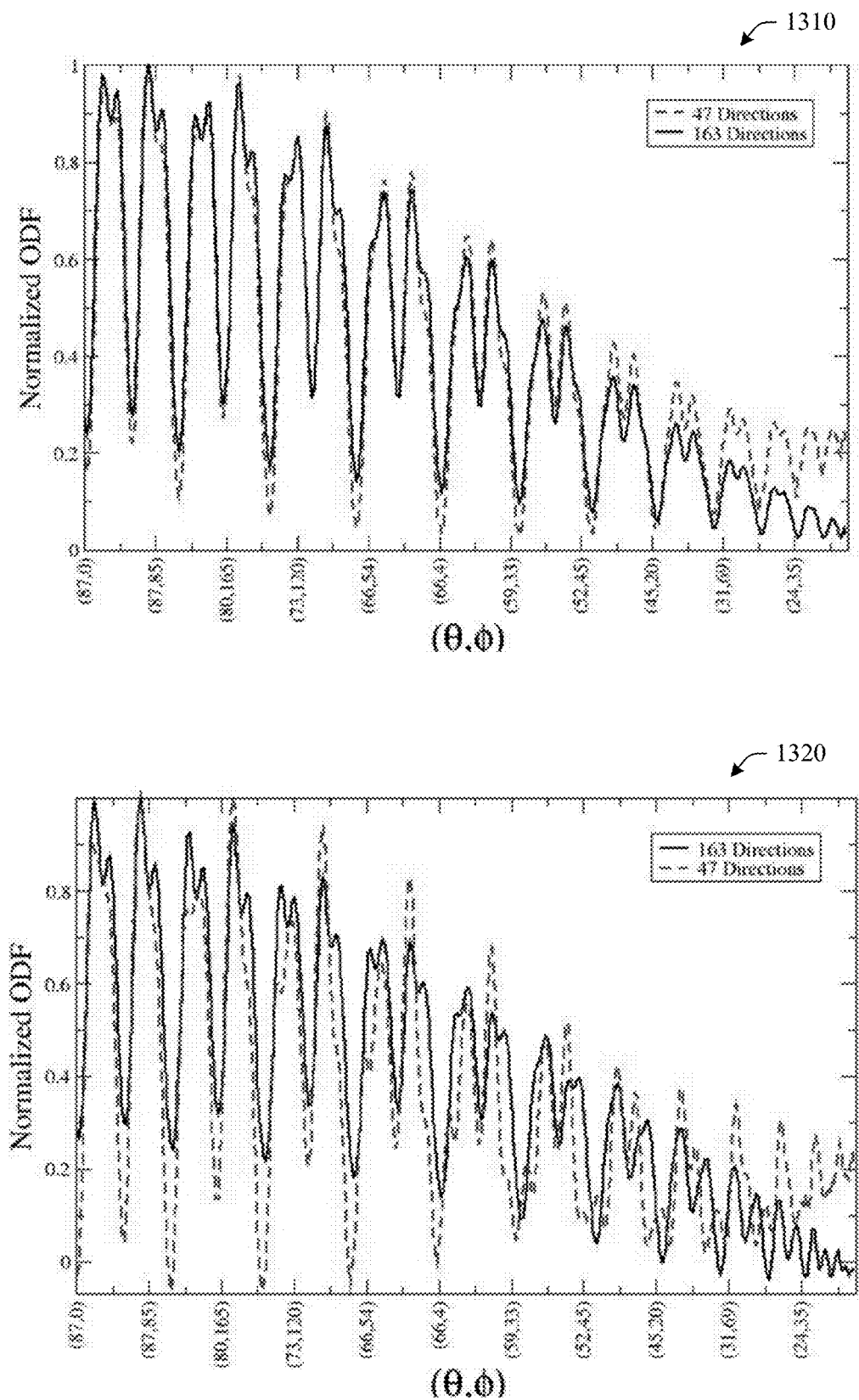
FIG. 13 illustrates the radial ODF's dependence on the angular resolution and noise.

FIG. 13 illustrates the radial ODF's dependence on the angular resolution and noise. In 1310, the values of the ODF as a function of the sampled angular position for a conservative maximum b-value of 5,000 s/mm² are presented for two radial grids with angular resolutions of 26 and 13 degrees, respectively. 1320 shows the results of the same calculations after Gaussian white noise (30%) was added to the q-space data are presented in the right panel. For this particular diffusivity, when the b-value decreases (from 10,000 to 5,000 s/mm²) the angular error increases from 0 to 12 degrees. When the same b-value is kept (10,000 s/mm²) and the angular resolution is decreased (from 430 to 97 directions on the surface) the angular error increases to 22 degrees.

As FIG. 13 illustrates, the ODF derived from the low-resolution radial raster does not clearly exhibit the peaks corresponding to the two fiber directions. When the raster is refined—without increasing the b-value—the two peaks are present and the fibers are resolved. The noise-corrupted results of graph 1320 also illustrate that the ability to resolve these fibers is not compromised by the additional q-space samples, due to the fact that the added data points have the same "effective" SNR (because the b-value was not increased).

Figure 14:
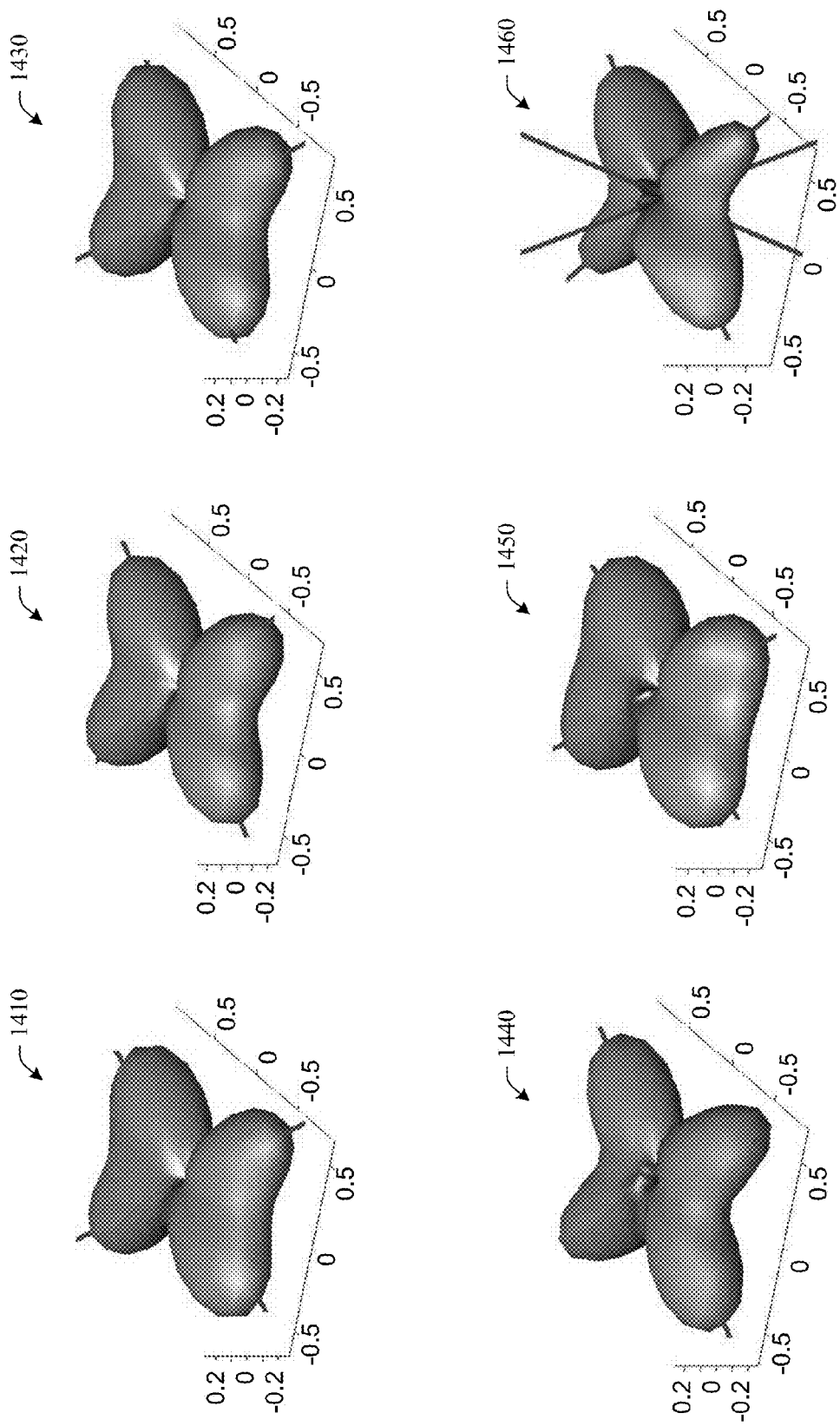
FIG. 14 illustrates reconstructed ODFs based on modeling and corresponding simulations.

FIG. 14 illustrates the reconstructed ODFs for this model and the corresponding simulations. In this figure, the traditional surface-rendered representation of the ODF is presented together with the lines denoting the fiber directions obtained from the peak detection algorithm used before the streamlines are drawn. ODF 1410 was reconstructed using 430 directions on the surface of the sphere with a maximum b-value of 10,000 s/mm². The measured angle between the fibers was 71.99 degrees. When the b-value was decreased to 5,000 s/mm² (the equivalent of lowering the resolution by a factor of two in conventional DSI) the measured angle is 65 degrees, a 10% error, seen in 1420. If on the other hand, the b-value is kept at 10,000 s/mm² and the angular resolution is halved (from 430 directions to 97 directions) the measured angle is 58 degrees, a 20%, or 2×, error, shown in 1430. This example illustrates that for a given diffusivity, there is a critical b-value beyond which the benefits of increased diffusion weighting are minimal. Similarly, once such critical b-value is used, the most effective means to improve the angular resolution is to increase the number of radial lines inside the sphere. ODFs 1440 to 1460 resulted from the same simulations as in the top row, except that 30% noise was added to the data. The angular error did not increase significantly when the angular sampling is high and the b-value is low, as seen by comparison of 1440 and 1450. However, for lower angular resolution and higher b-value, spurious fiber directions are introduced, as seen in 1460.

The foregoing discussion included techniques for improving the angular resolution of DSI (or conversely decrease the data acquisition time) by using a sampling raster in q-space that exploits the symmetry of the ODF, in accordance with aspects of the subject innovation. One aspect of employing this raster was the ability to compensate for the oversampling near the origin that is typical of radial acquisitions. Because the ODF is a real-valued and positive function, only half of the required volume in q-space needs to be experimentally acquired. Consequently, the oversampling of the center of q-space leads to only a two-fold increase in the total number of required excitations relative to a conventional Cartesian grid (as opposed to the typical factor of $\pi$ required when the positive and negative hemispheres need to be independently acquired). Given this consideration, the measurement of two or more q-space samples per TR will lead to a net gain in the acquisition efficiency of the radial DSI acquisition.

In aspects, the subject innovation can employ a DW, twice-refocused, spin echo sequence to sample more than one q-space point per RF excitation using substantially any technique of signal readout (including, but not limited to, the EPI used in connection with experiments discussed herein). Because of the radial symmetry being used, for any non-zero set of diffusion gradients, the q-space samples lying along the trajectory traversed in q-space as the diffusion time increases can be acquired in a single excitation so long as the corresponding signal is not completely depleted. Experimental results discussed herein demonstrate that this sequence can produce the same ODF as a conventional single-echo sequence when two samples per RF are collected, although in various aspects, the subject innovation can collect three or more samples per RF excitation, as well.

Figure 15:
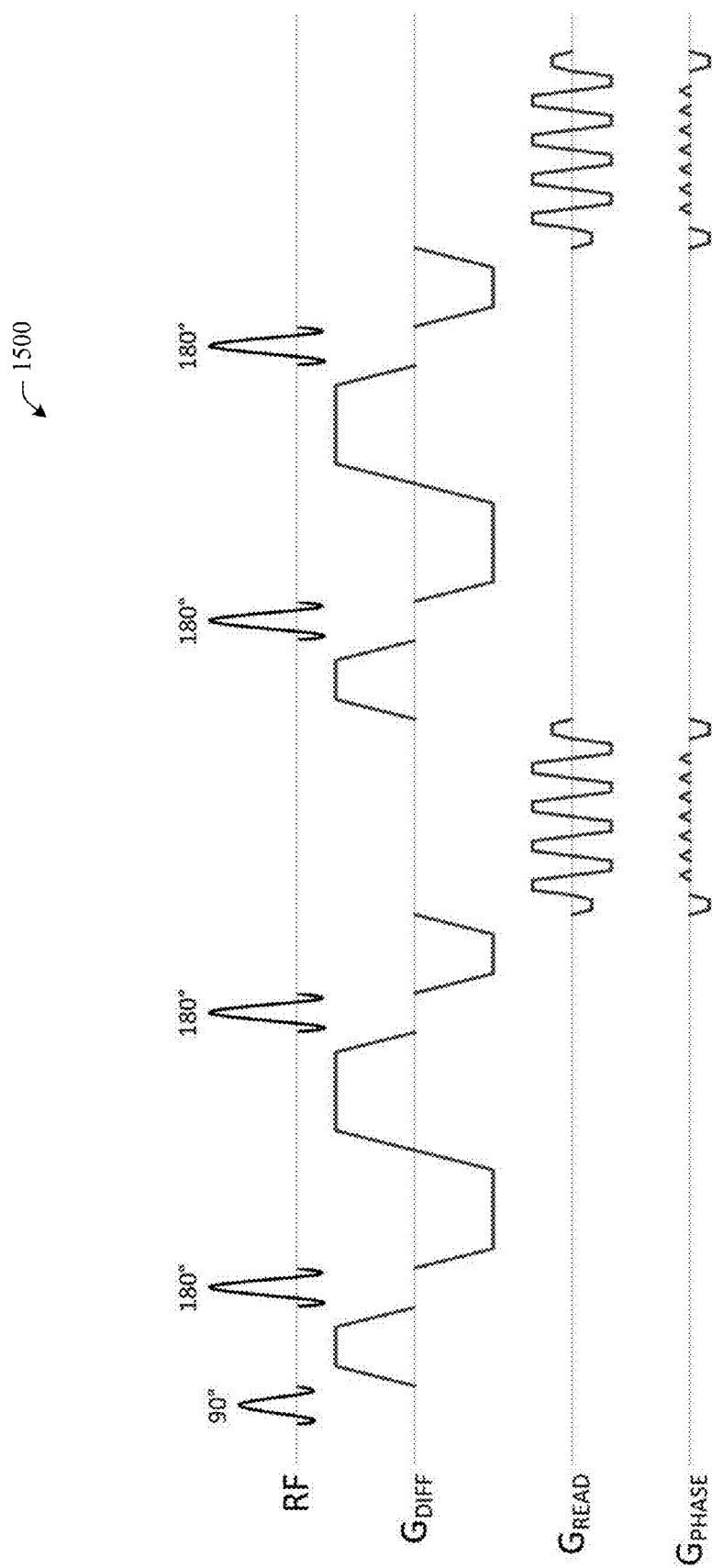
FIG. 15 illustrates an example timing diagram for collecting two samples per RF excitation
Figure 16:
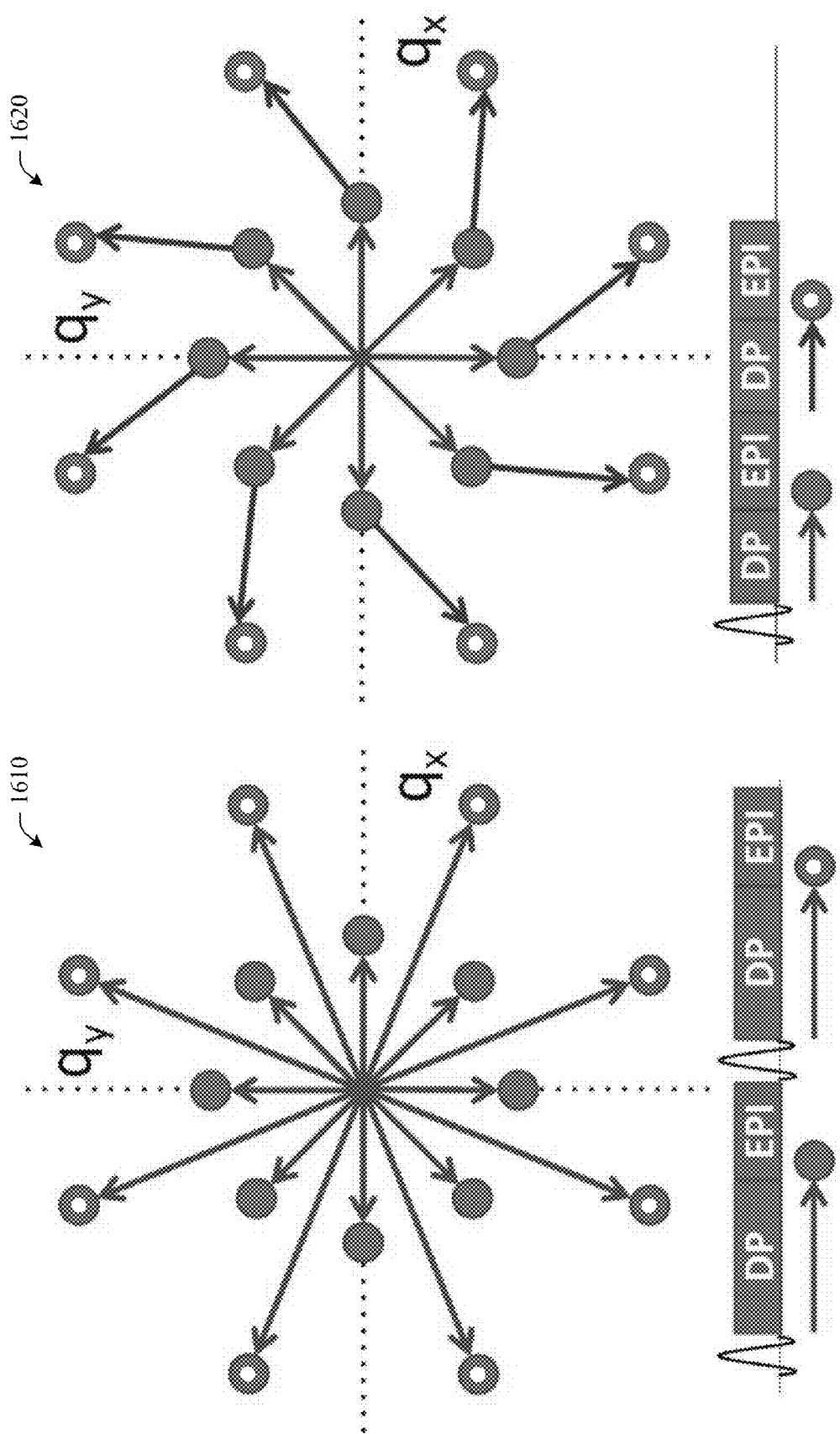
FIG. 16 illustrates a pictorial representation of the central "slice" of a 2-shell q-space sampling scheme using standard DSI and a two point q-space trajectory.
Figure 17:
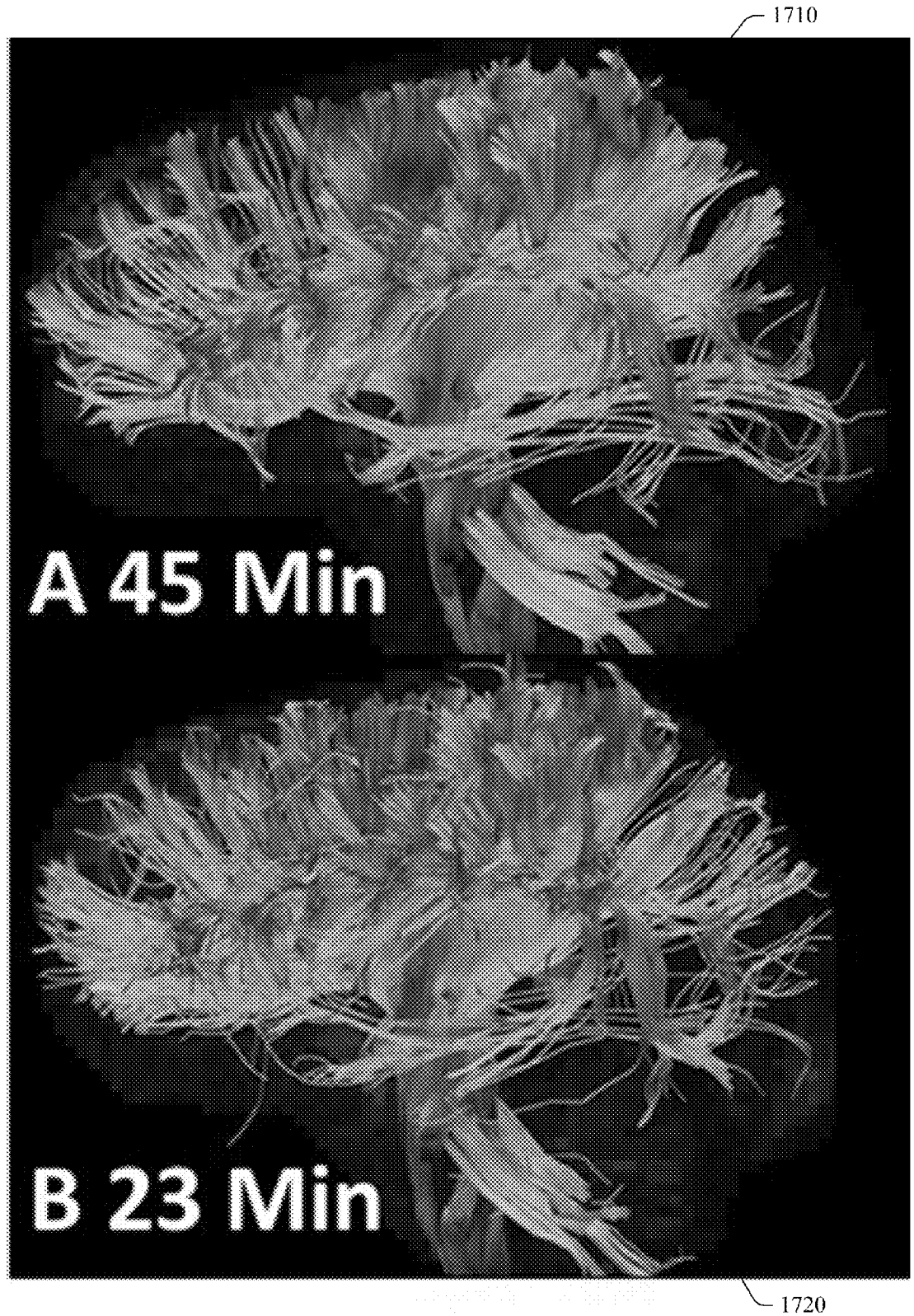
FIG. 17 illustrates a comparison of calculated tractograms using conventional DSI acquisition and sequential q-space acquisition.

FIG. 15 illustrates an example timing diagram 1500 for collecting two samples per RF excitation. This sequence was used to obtain results discussed herein. By varying the shape and amplitude of the diffusion gradient, trajectories of increasing radius in q-space can be traced. For simplicity, $G_{Diff}$ denotes the effective diffusion gradient (i.e., the vector modulus of the spatial diffusion gradient). It will be apparent to a person having skill in the art in light of the teachings herein that this sequence can be modified to incorporate collection of additional samples (third, fourth, . . . , nth, etc.) so long as the corresponding signal is not completely depleted. The sequence associated with timing diagram 1500 can incorporate a dual-refocused DWI encoding module followed by a data acquisition module. This structure was repeated twice (although more than two repetitions could be used) with the same gradient directions to effectively sample two (or more, for more repetitions) points in q-space per RF excitation (with experimental parameters of TE=180 ms, Readout=30 ms, b=1,000 s/mm²) Initial implementation of this "sequential" q-space sequence in the experiments was based on a modification of the standard Cartesian raster, and, consequently, only led to a limited speed up of the acquisition throughput because not all samples for different shells can be placed on a the same path for each independent TR. FIG. 16 illustrates a pictorial representation of the central "slice" of a 2-shell q-space sampling scheme using standard DSI at 1610 and the two point q-space trajectory of the experiment at 1620. The associated pulse sequence is shown below each q-space plane 1610 and 1620, showing RF excitation, diffusion preparation (DP) and signal readout (in the example shown, EPI readout (EPI) is used, although other techniques of signal readout can be used, as would be appreciated by a person of skill in the art). Notably, each q-space trajectory TR in 1620 is shorter than the equivalent 2×TR for a conventional sequence in 1610. It is to be appreciated that although this experiment focused on the q-space trajectory and employed a modified Cartesian raster, in aspects of the subject innovation, other rasters can be employed, such as the radial raster described herein, which can provide additional improvements in acquisition time. FIG. 17 illustrates a comparison of the calculated tractograms using the conventional DSI acquisition in 1710 and the sequential q-space acquisition 1710. As FIG. 17 clearly shows, the reconstructed tractograms are nearly identical.

Aspects of the subject innovation can be used to dramatically reduce times for the acquisition of imaging data, such as HDFT data in humans. Although aspects of the innovation (e.g., radial raster, q-space trajectories, etc.) can be employed independently, they can also be used together. In aspects, the innovation can employ a pulse sequence, DSI reconstruction and ODF post-processing approaches described herein that can allow the acquisition of HDFT data with the angular and spatial resolution demonstrated above in less than 15 minutes. The data indicates that the radial raster approach described herein is capable of providing higher nominal angular resolution for the same b-value and total acquisition time than conventional DSI, provided that at least two q-space samples can be acquired every TR (although more than 2, e.g., 3, 4, etc. can be acquired per TR).

Additionally, these techniques can be employed in conjunction with compressed sensing in q-space and multi-band and "deferred echo" techniques in k-space. In aspects, the subject innovation can implement a twice-refocused (or more than twice), spin-echo (SE) DW MRI sequences (such as described above, e.g., in connection with FIG. 17) in conjunction with echo sharing techniques as a means to obtain more than one q-space sample per TR. In other aspects, stimulated echo (STE) and hybrid (SE-STE) DW sequences can be alternatively employed to acquire two or more q-space samples per TR. Additionally, compressed sensing techniques can be employed (e.g., on a radial raster, etc.) as a means to further reduce the acquisition time. In other aspects, multi-band excitation schemes can optionally be integrated into the multi-q-space imaging sequences discussed above.

As explained in greater detail above, in aspects the innovation can efficiently acquire more than one q-space sample per TR by "briefly" stopping the diffusion gradients as the radial q-space trajectory was traced. Because the b-value increases non-linearly with the radial trajectory in q-space, halving and concatenating a diffusion preparation block does not yield the same effective b-value as the original diffusion block. Consequently, efficient use of the length of time available after exciting the signal for a slice can help achieve an appropriate level of diffusion contrast as the direction of the gradient changes in q-space.

As shown in the simulations discussed above, for the range of diffusivities reported in the human brain, a b-value of 5,000 s/mm$^2$ in conjunction with a high-angular resolution radial raster can provide the same level of effective angular resolution as the Cartesian DSI acquisitions (257 total excitations, b=7,000 s/mm$^2$). In an example illustrating aspects of the subject innovation, effective b-values of 2,500 s/mm$^2$ per block for each of the diffusion blocks for dual q-space sample sequence and a b-value of 1,250 s/mm$^2$ per block on a four q-space sample sequence can be employed. These example b-values correspond to diffusion blocks of 40 ms to 70 ms, which for the maximum echo time to remain below 160 ms, limits the readout for the first q-space sample to 30 ms and 20 ms, respectively. These short readouts can be accomplished using variable density spiral trajectories and echo sharing, which can correspond to a 40-60% reduction in sample density for the high spatial frequencies, with a 96×96 matrix size. Echo-shared data can be reconstructed using the non-Cartesian, sensitivity encoding (SENSE) image reconstruction schemes.

Figure 18:
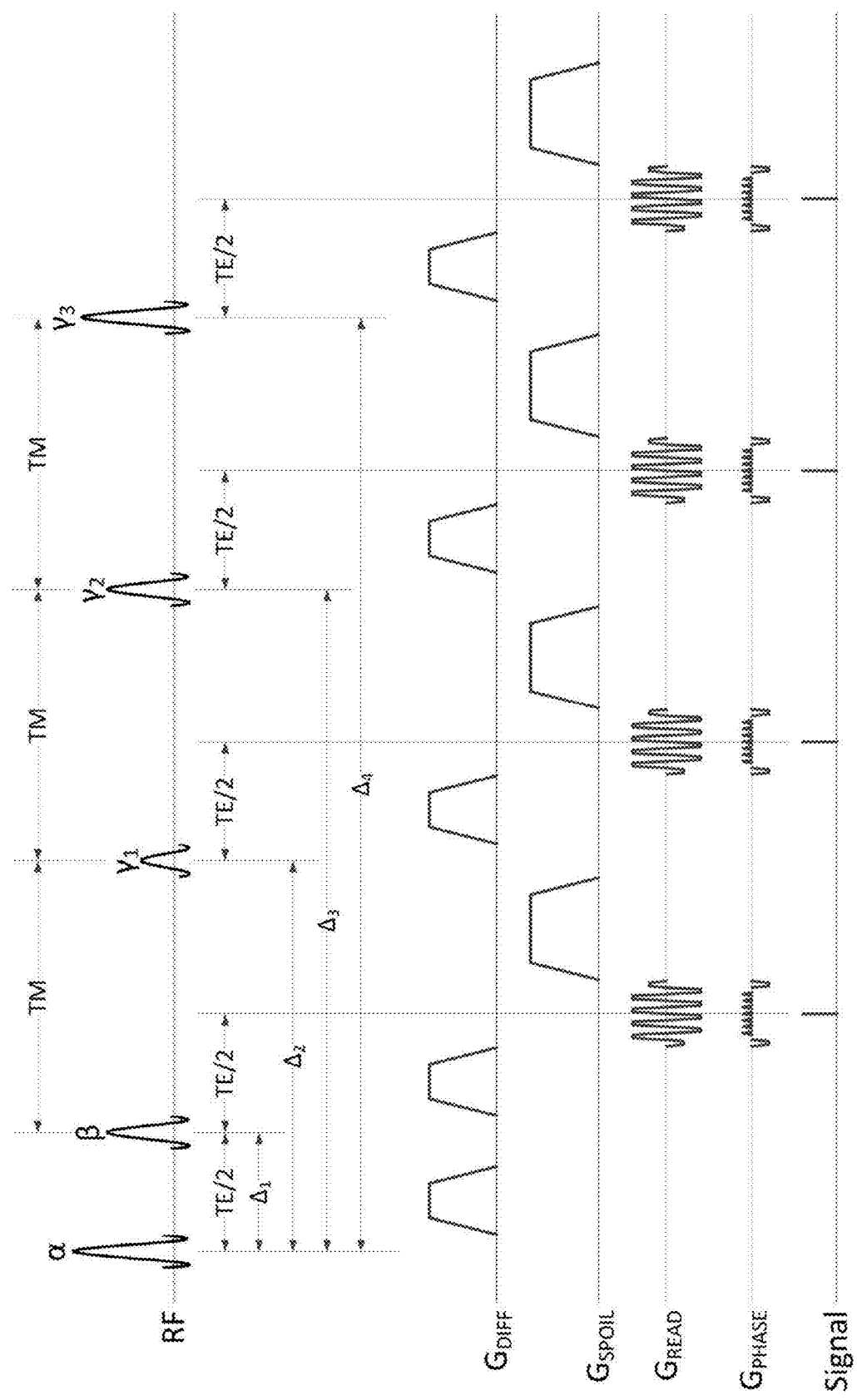
FIG. 18 illustrates an example timing diagram for a stimulated echo (STE) sequence in accordance with aspects of the subject innovation.

Stimulated echo (STE) acquisitions have been previously used in connection with DW MRI. Two salient features of STE sequences have led to their use in this setting: (1) Their robustness against eddy current and field inhomogeneity artifacts; and (2) their ability to increase the diffusion time without a concomitant increase in the echo time. This latter feature stems from the storage of the diffusion-weighted magnetization along the z-axis during the mixing time and allows for an effective increase in the diffusion weighting without the accrual of excessive T2-decay, provided $e^{-T/T_2} \gg 2e^{-T_M/T_1}$. FIG. 18 illustrates an example timing diagram for an STE sequence in accordance with aspects of the subject innovation. Note that as multiple q-space samples are acquired, the effective diffusion time will change. In the implementation presented in FIG. 18, four q-space points per TR are collected in q-space (although more can be collected in other implementations in accordance with the subject innovation). The magnetization stored along the z-axis decays with T1, and thus allows for an increase in diffusion weighting without excessive T2-related signal loss, as discussed above.

Compressed sensing (CS) can also be employed in aspects of the subject innovation. CS exploits the sparse nature of an image in order to vastly reduce the number of required spatial frequency samples required for an artifact-free reconstruction. This is achieved by minimizing the coherence of the truncation artifacts introduced during the reconstruction process using non-linear optimization techniques. CS can provide ODF's of comparable quality to those used with the conventional DSI sampling scheme. Aspects of the subject innovation can employ a CS sampling scheme in q-space in conjunction with other techniques, for example, one that is suitable for the radial sampling scheme discussed above.

Multi-band excitation in k-space can also be employed in aspects of the subject innovation. Another time-consuming aspect of the existing DSI protocols is the need for long repetition times (>9,000 ms). This need is a direct result of the excitation of a large number of slices in an interleaved fashion. Multi-band excitation techniques can be used to reduce the effective TR by using RF pulses that selectively excite more than one slice per TR and retrospectively sort the corresponding slice signal based on the corresponding resonant frequency. This concept is similar to the SMART, RSI and CAPIRINHA schemes. A modest two-fold reduction of the repetition time in combination with the aforementioned q-space sampling schemes can reduce acquisition times to less than or equal to 15 minutes per scan.

Additional experimental results were obtained in connection with aspects described herein. These experiments were performed on a Siemens 3.0T system (Trio, Siemens Healthcare) in accordance with local institutional review board (IRB) protocol. A standard twice-refocused spin echo EPI pulse sequence was modified to allow for multiple DPs and signal readouts (in the experiment, EPI readouts, although alternatives can be used) following excitation. Each TR becomes longer as a result, but the overall reduction in number of TRs by a factor of q-space trajectory length and shorter DP time results in overall acceleration, as described above and shown in FIG. 16, where a single 2-point q-space trajectory TR is shorter than the equivalent 2 TRs from a conventional sequence.

Figure 19:
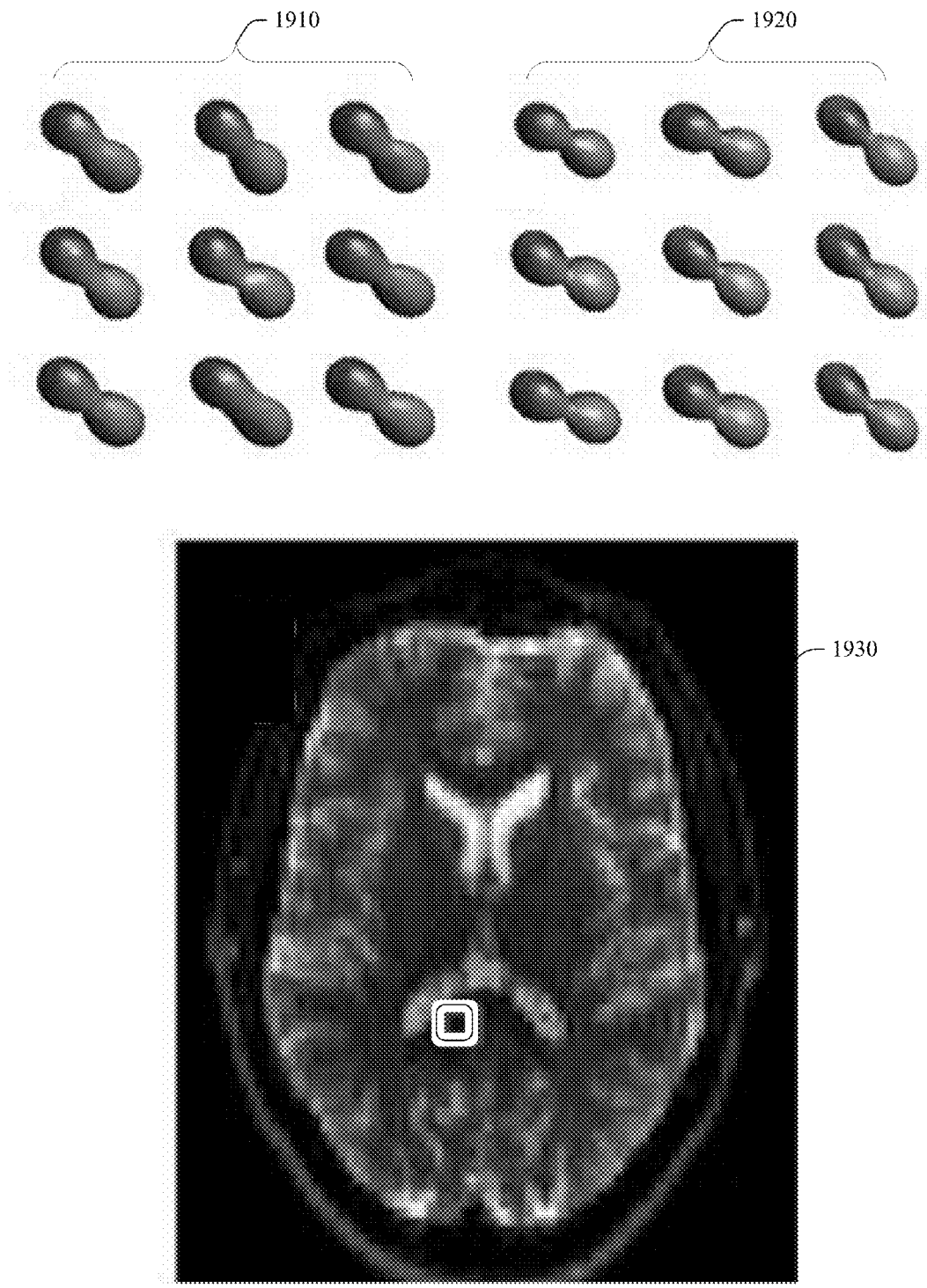
FIG. 19 illustrates representative examples of ODFs obtained from standard techniques and from a q-space trajectory sequence from the corpus callosum.

In an experiment, an asymptomatic volunteer was imaged (FOV=231 mm, 96×96 matrix, 54×2 4 mm slices, BW=1390 Hz/px, DSI half sphere gradient table with 128 directions, GRAPPA R=2) with a conventional sequence (TE/TR=88 ms/6900 ms, TA=14:50) and the q-space trajectory sequence (TE1/TE2/TR=81 ms/190 ms/11800 ms, TA=12:47). Informed consent was obtained in accordance with local IRB. ODFs were reconstructed from the diffusion-weighted images using the generalized q-sampling technique. FIG. 19 illustrates representative examples of ODFs at 1910 (employing standard techniques) and 1920 (from a q-space trajectory sequence) from the corpus callosum area shown by the box in 1930.

The ODFs shown in FIG. 19 demonstrate that the q-space trajectory technique achieves comparable fiber resolution as the conventional technique. Because the q-space trajectory approach is independent of the reconstruction scheme, other techniques such as compressed sensing and multi-band imaging can optionally be used in conjunction with q-space trajectory techniques discussed herein to further improved acquisition throughput. Results indicate this can provide a better than 50% reduction in data acquisition time for DSI and other lengthy tractography acquisitions.

A further experiment employed a twice-refocused spin-echo (SE) EPI sequence in comparison with a conventional sequence. The following parameters were common to both: FOV=231 mm, 96×96 matrix, 54×2 4 mm slices, BW=1390 Hz/px, DSI half sphere gradient table with 128 directions, $b_{max}$=1000 s/mm$^2$, GRAPPA [4] R=2, Siemens 32ch head coil. The conventional sequence had TE/TR=88 ms/6900 ms, and acquisition time (TA)=14:50, while the q-space trajectory sequence had $TE_1/TE_2$/TR=81 ms/190 ms/11800 ms, TA=12:47. In aspects of the innovation, however, various parameters and techniques (e.g., different signal readout, etc.) employed may be varied, as described elsewhere herein.

Figure 20:
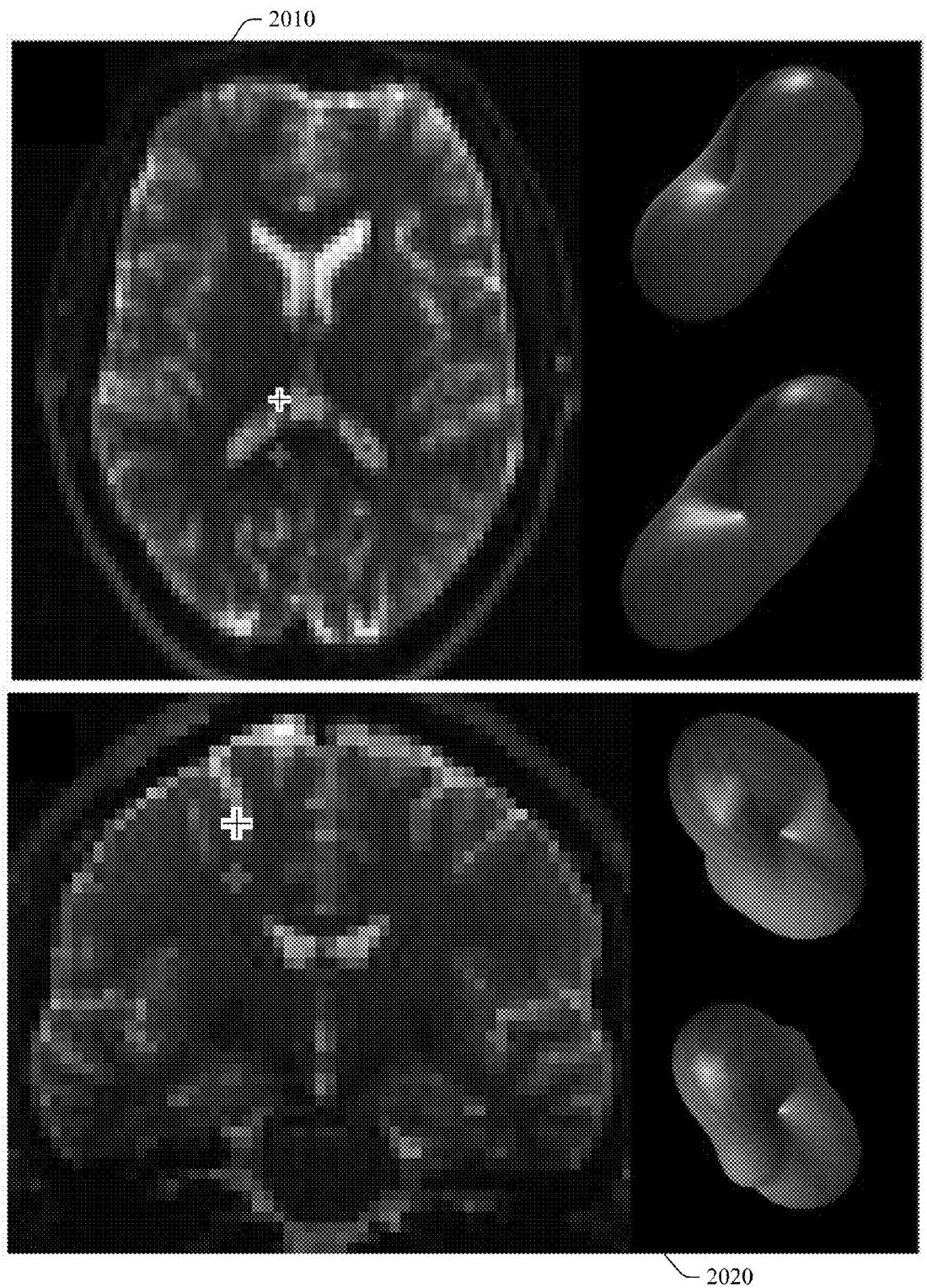
FIG. 20 illustrates representative ODFs alongside MRI images for the corpus callosum and centrum semiovale.

FIG. 20 illustrates representative ODFs in 2010 and 2020 alongside MRI images for the corpus callosum (in 2010) and centrum semiovale (in 2020), and show qualitative agreement between the techniques. For each of 2010 and 2020, the upper ODF is obtained using standard techniques, and the lower ODF from a q-space trajectory sequence. Root mean square error (RMSE) measurements give the differences between the 2 ODFs, with values of 0.0031 and 0.0054 for 2010 and 2020, respectively, confirming a quantitative agreement. The q-space trajectory approach is independent of the reconstruction scheme, as discussed above, and other techniques such as compressed sensing and multi-band imaging can be used in conjunction with our technique to further improve acquisition throughput.

Figure 21:
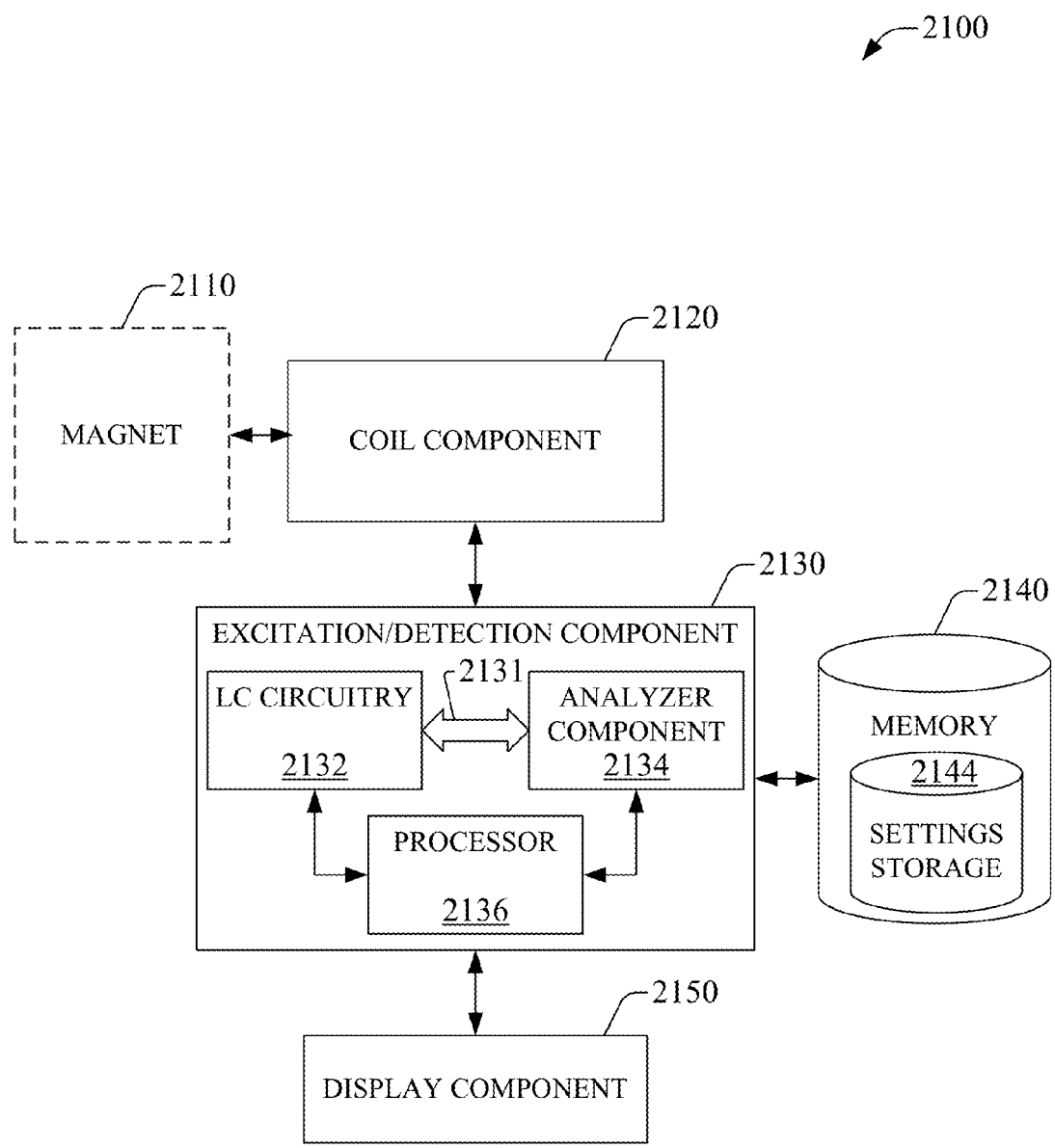
FIG. 21 illustrates an example magnetic resonance system useable in connection with aspects of the subject innovation.

FIG. 21 illustrates an example magnetic resonance system 2100 useable in connection with aspects of the subject innovation. The techniques of the subject innovation can be used in connection with any MRI system, such as the 3T systems discussed herein, as well as other conventional MRI systems. System 2100 is one such example system. System 2100 can comprise a magnet 2110 that can provide an external field ($B_0$) and a coil component 2120 (comprising one or more coils) that can be used to obtain imaging data. Example system 2100 can include an excitation/detection component 2130 coupled to a settings storage 2144 that resides within a memory 2140. In addition, example system 2100 includes a display component 2150 for analysis and manipulation of data.

Excitation/detection component 2130 can include LC circuitry 2132 which includes RF matching/tuning circuitry as discussed above, which can be employed to automatically tune to one or more resonance Larmor frequencies for one or more selected nuclei (e.g., Hydrogen nuclei) at the operation external magnetic field ($B_0$) provided by magnet 2110. In addition, component 2130 can include RF electronics, e.g., included within LC circuitry 2132, to generate a sequence of applied pulses (e.g., $\pi/2$ and $\pi$ pulses), which can include application of multiple pulses at specific time intervals such as TE and TR, in order to accomplish specific excitation of nuclear spin targets for monitoring and detection of spin dynamics. As an example, predetermined excitation sequences such as those discussed herein can be stored in settings storage 2144. Excitation/detection component 2130, through analyzer component 2134, can determine slices (e.g., axial, coronal, or sagittal) for probing intracranial or extracranial tissue (e.g., soft tissue) and can also process data according to a selected algorithm, including but not limited to employing techniques for three dimensional imaging.

In various embodiments, LC circuitry 2132 can be functionally coupled to an analyzer component 2134 through a link component 2131. In an aspect, analyzer component 2134 can include a network analyzer that can facilitate characterization of coil resonance features for one or more coils. Analyzer component 2134 can allow direct determination of the coil quality factor (Q) and estimation of a return-loss factor for the coil. In addition, analyzer component 2134 can facilitate, via a Smith chart, assessment of actual inductance and capacitance in the LC circuitry that includes the coils. Moreover, a Smith chart can facilitate adjusting the impedance between LC circuitry 2132 and analyzer component 2134. It should be appreciated that LC circuitry 2132 can include one or more coils.

Processor 2136 can confer, at least in part, functionality to one or more components of example system 2100. In an aspect, processor 2136 can execute code instructions in software or firmware in order to provide components with their specific functionality; e.g., a processor can execute code instructions to generate a sequence associated with acquiring multiple points in q-Space in a single TR, or any other sequence, utilized to excite one or more coils within coil component 2120. Memory 2140 can retain the code instructions in software or firmware that processor 2136 can execute. In addition, memory 2140 can retain settings storage that includes microscopic parameters associated with operation of coil component 2120 and substantially any component in example system 2100.

What has been described above includes examples of the innovation. It is, of course, not possible to describe every conceivable combination of components or methodologies for purposes of describing the subject innovation, but one of ordinary skill in the art may recognize that many further combinations and permutations of the innovation are possible. Accordingly, the innovation is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A method of applying a magnetic resonance imaging (MRI) pulse sequence, comprising:
applying, via a coil, a single radio frequency (RF) excitation pulse to excite a first set of nuclei associated with a first slice;
applying a first diffusion preparation (DP) to the set of nuclei;
obtaining first diffusion data associated with a first point in q-space via application of a first signal readout;
applying a second DP to the set of nuclei; and
obtaining second diffusion data associated with a second point in q-space via application of a second signal readout, wherein the first point in q-space and the second point in q-space are sampled according to a raster that acquires additional radial lines intersecting a surface of a sphere by oversampling gradient directions.

2. The method of claim 1, wherein the first diffusion data and the second diffusion data are obtained in response to the single RF excitation pulse and wherein the raster is a radial raster.

3. The method of claim 1, wherein the first diffusion data and the second diffusion data are obtained according to a spin-echo acquisition technique.

4. The method of claim 1, wherein the first diffusion data and the second diffusion data are obtained according to a stimulated echo acquisition technique.

5. The method of claim 1, wherein the first diffusion data and the second diffusion data are obtained according to a hybrid spin-echo stimulated echo acquisition technique.

6. The method of claim 1, wherein the first point in q-space and the second point in q-space are sampled according to a compressed sensing algorithm.

7. The method of claim 1, further comprising:
applying a third DP to the set of nuclei; and
obtaining third diffusion data associated with a third point in q-space via application of a third signal readout.

8. The method of claim 7, further comprising:
applying a fourth DP to the set of nuclei; and
obtaining fourth diffusion data associated with a fourth point in q-space via application of a fourth signal readout.

9. The method of claim 1, wherein the single RF excitation pulse excites a second set of nuclei associated with a second slice based at least in part on a multi-band excitation technique.

10. The method of claim 1, wherein an orientation diffusion function (ODF) is determined based at least in part on the first diffusion data and the second diffusion data.

11. The method of claim 1, wherein the first point in q-space and the second point in q-space are sampled according to a modified Cartesian raster.

12. A magnetic resonance imaging (MRI) system, comprising:
a magnet that generates an external field $B_0$;
an excitation/detection component that implements a q-space trajectory pulse sequence; and
a coil component that obtains information associated with an anatomical region based on a q-space trajectory pulse sequence, wherein the coil component applies a single radio frequency (RF) excitation pulse to excite a first set of nuclei associated with a first slice of the anatomical region, wherein the coil component applies a first diffusion preparation (DP) to the set of nuclei, wherein the coil component obtains first diffusion data associated with a first point in q-space via application of a first signal readout, wherein the coil component applies a second DP to the set of nuclei, and wherein the coil component obtains second diffusion data associated with a second point in q-space via application of a second signal readout, wherein the first point in q-space and the second point in q-space are sampled according to a raster that acquires additional radial lines intersecting a surface of a sphere by oversampling gradient directions.

13. The system of claim 12, wherein the first diffusion data and the second diffusion data are obtained in response to the single RF excitation pulse and wherein the raster is a radial raster.

14. The system of claim 12, wherein the coil component obtains the first diffusion data and the second diffusion data according to a spin-echo acquisition technique.

15. The system of claim 12, wherein the coil component obtains the first diffusion data and the second diffusion data according to a stimulated echo acquisition technique.

16. The system of claim 12, wherein the coil component obtains the first diffusion data and the second diffusion data according to a hybrid spin-echo stimulated echo acquisition technique.

17. The system of claim 12, wherein the coil component samples first point in q-space and the second point in q-space according to a compressed sensing algorithm.

18. The system of claim 12, wherein the coil component applies a third DP to the set of nuclei and obtains third diffusion data associated with a third point in q-space via application of a third signal readout.

19. The system of claim 18, wherein the coil component applies a fourth DP to the set of nuclei and obtains fourth diffusion data associated with a fourth point in q-space via application of a fourth signal readout.

20. A magnetic resonance imaging (MRI) system, comprising:
means for generating an external field $B_0$;
means for implementing a q-space trajectory pulse sequence; and
means for obtaining information associated with an anatomical region based on a q-space trajectory pulse sequence, wherein the means for obtaining applies a single radio frequency (RF) excitation pulse to excite a first set of nuclei associated with a first slice of the anatomical region, applies a first diffusion preparation (DP) to the set of nuclei, obtains first diffusion data associated with a first point in q-space via application of a first signal readout, applies a second DP to the set of nuclei, and obtains second diffusion data associated with a second point in q-space via application of a second signal readout, wherein the first point in q-space and the second point in q-space are sampled according to a raster that acquires additional radial lines intersecting a surface of a sphere by oversampling gradient directions.

* * * * *

UNITED STATES PATENT AND TRADEMARK OFFICE
CERTIFICATE OF CORRECTION

PATENT NO. : 9,488,710 B2  
APPLICATION NO. : 13/832891  
DATED : November 8, 2016  
INVENTOR(S) : Fernando E. Boada et al.

Page 1 of 1

It is certified that error appears in the above-identified patent and that said Letters Patent is hereby corrected as shown below:

In the Specification

Column 1, Lines 16-19, "This innovation was made with government support under grant # MH088370 awarded by the National Institutes of Health. The government has certain rights in the invention." should read --This invention was made with government support under grant number MH088370 awarded by the National Institutes of Health. The government has certain rights in the invention.--.
Column 2, Line 53, "excitation" should read --excitation.--.
Column 4, Line 23, "quality Improved" should read --quality. Improved--.
Column 4, Line 31, "can be acquire" should read --can acquire--.
Column 5, Line 39, "selected than" should read --selected other than--.
Column 6, Line 52, "then used" should read --then be used--.
Column 8, Line 48, "gyms" should read --gyrus--.
Column 8, Line 51, "gyms" should read --gyrus--.
Column 9, Line 44, "gyms" should read --gyrus--.
Column 9, Line 54, "gyms" should read --gyrus--.
Column 9, Line 67, "gyms" should read --gyrus--.
Column 10, Line 1, "gyms" should read --gyrus--.
Column 10, Line 2, "gyms" should read --gyrus--.
Column 10, Line 8, "gyms" should read --gyrus--.
Column 10, Line 9, "gyms" should read --gyrus--.
Column 10, Line 10, "gyms" should read --gyrus--.
Column 14, Line 61, "on a the" should read --on the--.
Column 17, Line 7, "2 4 mm" should read --2.4 mm--.
Column 17, Line 26, "improved" should read --improve--.
Column 17, Line 33, "2 4 mm" should read --2.4 mm--.

Signed and Sealed this  
Nineteenth Day of March, 2019

Andrei Iancu  
*Director of the United States Patent and Trademark Office*